(12) United States Patent
Chu et al.

(10) Patent No.: US 11,901,236 B2
(45) Date of Patent: Feb. 13, 2024

(54) SEMICONDUCTOR STRUCTURE WITH GATE-ALL-AROUND DEVICES AND STACKED FINFET DEVICES

(71) Applicant: Taiwan Semiconductor Manufacturing Company, Ltd., Hsinchu (TW)

(72) Inventors: Feng-Ching Chu, Hsinchu (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/739,925

(22) Filed: May 9, 2022

(65) Prior Publication Data
US 2022/0262683 A1  Aug. 18, 2022

Related U.S. Application Data

(63) Continuation of application No. 17/027,240, filed on Sep. 21, 2020, now Pat. No. 11,328,960.

(51) Int. Cl.
*H01L 21/8234* (2006.01)
*H01L 27/088* (2006.01)
(Continued)

(52) U.S. Cl.
CPC .............. *H01L 21/823431* (2013.01); *H01L 21/02532* (2013.01); *H01L 21/02603* (2013.01);
(Continued)

(58) Field of Classification Search
CPC ......... H01L 21/02532; H01L 21/02603; H01L 21/823412; H01L 21/823418;
(Continued)

(56) References Cited

U.S. PATENT DOCUMENTS

| 2020/0066839 A1 | 2/2020 | Zhang |
| 2020/0219879 A1 | 7/2020 | Shin |

(Continued)

OTHER PUBLICATIONS

Jhon Jhy Liaw et al., "Fin End Isolation Structure for Semiconductor Devices", U.S. Appl. No. 16/944,381, filed Jul. 31, 2020, 39 pages of specification, 34 pages of drawings.

*Primary Examiner* — Cheung Lee
(74) *Attorney, Agent, or Firm* — HAYNES AND BOONE, LLP

(57) ABSTRACT

An integrated circuit (IC) includes a substrate and a first transistor on the substrate. The first transistor includes two first source/drain features, a stack of first semiconductor layers and second semiconductor layers alternately stacked one over another and disposed between the two first source/drain features, a first gate dielectric layer disposed over top and sidewalls of the stack of the first and the second semiconductor layers, a first gate electrode layer disposed over the first gate dielectric layer, and first spacer features disposed laterally between each of the second semiconductor layers and each of the two first source/drain features and electrically isolating each of the second semiconductor layers from each of the two first source/drain features. The first semiconductor layers electrically connect the two first source/drain features.

20 Claims, 17 Drawing Sheets

(51) Int. Cl.
*H01L 29/06* (2006.01)
*H01L 29/423* (2006.01)
*H01L 29/786* (2006.01)
*H01L 29/66* (2006.01)
*H01L 21/02* (2006.01)
*H01L 21/8238* (2006.01)

(52) U.S. Cl.
CPC ............... *H01L 21/823412* (2013.01); *H01L 21/823418* (2013.01); *H01L 21/823437* (2013.01); *H01L 27/0886* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78696* (2013.01); *H01L 21/823807* (2013.01); *H01L 21/823821* (2013.01)

(58) Field of Classification Search
CPC ..... H01L 21/823431; H01L 21/823437; H01L 21/823807; H01L 21/823821; H01L 27/0886; H01L 27/0924; H01L 29/0673; H01L 29/42392; H01L 29/66545; H01L 29/66553; H01L 29/66636; H01L 29/66742; H01L 29/7831; H01L 29/78696; H01L 21/823456; H01L 21/823481; H01L 21/82385; H01L 21/823878; H01L 27/0922; H01L 29/1054; H01L 29/1079; H01L 29/66439; H01L 29/775

See application file for complete search history.

(56) References Cited

U.S. PATENT DOCUMENTS

| | | |
|---|---|---|
| 2020/0343387 A1 | 10/2020 | Liaw |
| 2020/0381555 A1* | 12/2020 | Lee ................. B82Y 10/00 |
| 2021/0273103 A1 | 9/2021 | Chen et al. |
| 2022/0052155 A1 | 2/2022 | Liaw |

* cited by examiner

12 — Provide a structure having a substrate, fins protruding out of the substrate in both a first area and a second area, isolation structure over the substrate and isolating the fins, and sacrificial gates over the isolation structure and the fins, the fins having alternately stacked first and second semiconductor layers 14 — Etch the fins to form source/drain (S/D) trenches in the first area and the second area 16 — Recess the second semiconductor layers in the S/D trenches, resulting in gaps between the first semiconductor in the first area and the second area 18 — Form inner spacer features in the gaps in the first area and the second area 20 — Epitaxially grow source/drain (S/D) features in the S/D trenches in the first area and the second area 22 — Form an etch stop layer and an inter-level dielectric (ILD) layer

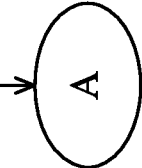

FIG. 1A

SEMICONDUCTOR STRUCTURE WITH GATE-ALL-AROUND DEVICES AND STACKED FINFET DEVICES

PRIORITY

This is a continuation of U.S. patent application Ser. No. 17/027,240, filed Sep. 21, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all-around (GAA) device, which includes a gate structure that wraps around a channel region to provide access to the channel region on multiple sides. Example GAA devices include vertically stacked gate-all-around (GAA) horizontal nanowire (NW) and nanosheet (NS) devices. GAA devices enable aggressive scaling down of IC technologies, maintaining gate control and mitigating SCEs, while seamlessly integrating with conventional IC manufacturing processes. However, the vertical space between adjacent wire channels or sheet channels in GAA devices limits the thickness of the gate dielectric layer(s). For this reason, the GAA devices may not be suitable for certain applications where a thick gate dielectric layer is desired, such as for input/output (I/O) functions. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A and FIG. 1B are a flow chart of a method for fabricating a multi-gate device according to various aspects of the present disclosure.

DETAILED DESCRIPTION

Figure 1B:
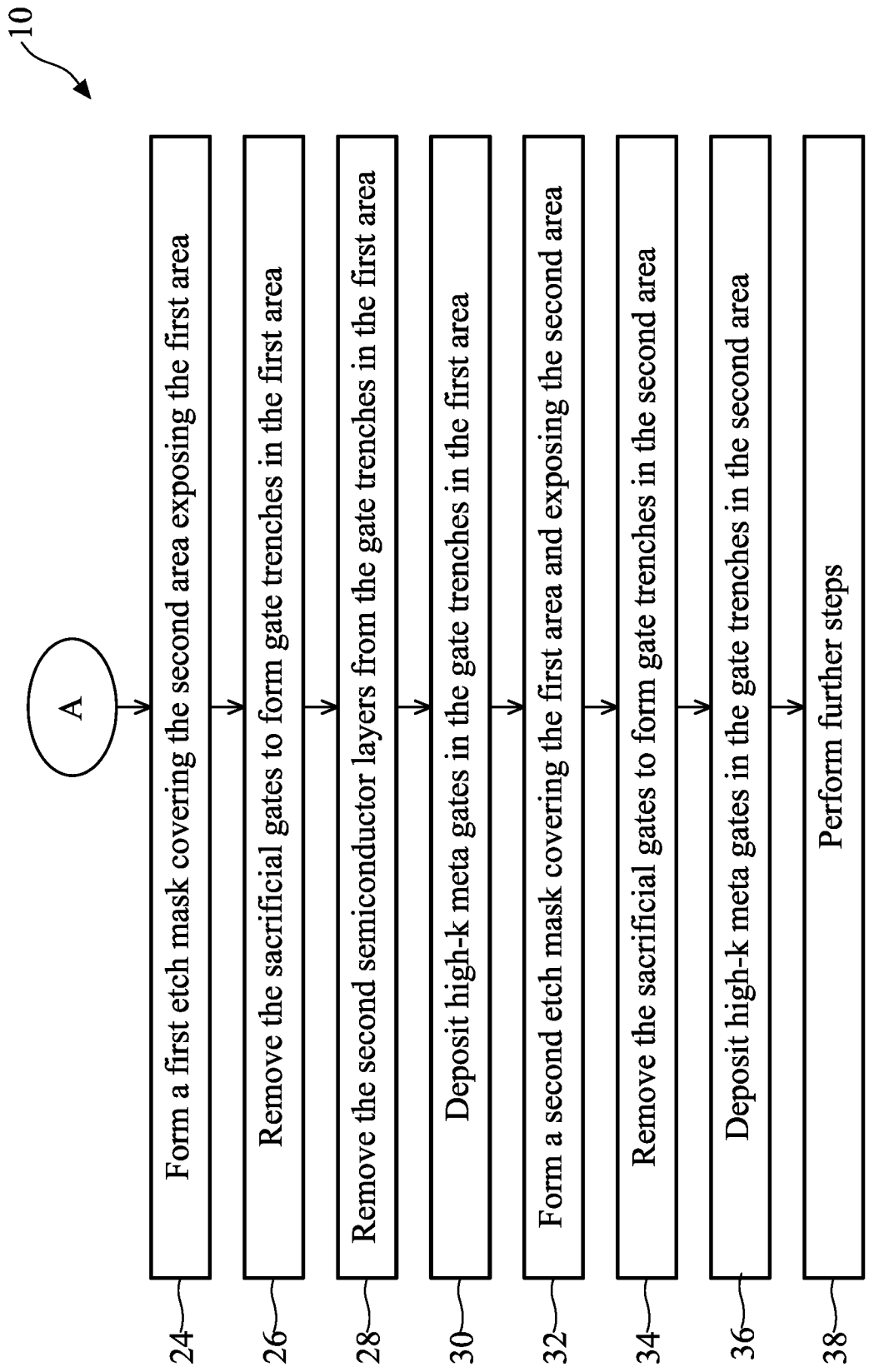

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates generally to semiconductor devices and their manufacturing methods, and more particularly to forming gate-all-around (GAA) devices in a first area of an integrated circuit (IC) and forming stacked FinFET devices in a second area of the IC. For example, the GAA devices may be implemented for low-power circuits and/or high-speed circuits in a first area of the IC, and the stacked FinFET devices may be implemented for I/O circuits, ESD (electrostatic discharge) circuits, and/or other circuits. In an embodiment, the stacked FinFET devices have thicker gate dielectric than the GAA devices. In another embodiment, the stacked FinFET devices have longer gate length than the GAA devices. Each of the GAA devices includes a pair of source/drain (S/D) features, multiple vertically stacked horizontally oriented channels connecting the S/D features, and a high-k metal gate wrapping around each of the channels. Each of the stacked FinFET devices includes a pair of source/drain (S/D) features, a stack fin structure, and a high-k metal gate disposed on top and sidewall surfaces of the stack fin structure. The stack fin structure includes multiple first semiconductor layers and multiple second semiconductor layers alternately stacked one over another. Each of the GAA devices further includes inner spacer features horizontally between the high-k metal gate and the pair of S/D features. Each of the stacked FinFET devices further includes inner spacer features horizontally between the second semiconductor layers and the pair of S/D features. The inner spacers in the GAA devices and in the stacked FinFET devices may be formed by the same process and have the same material(s) to simplify the manufacturing flow.

Figure 2A:
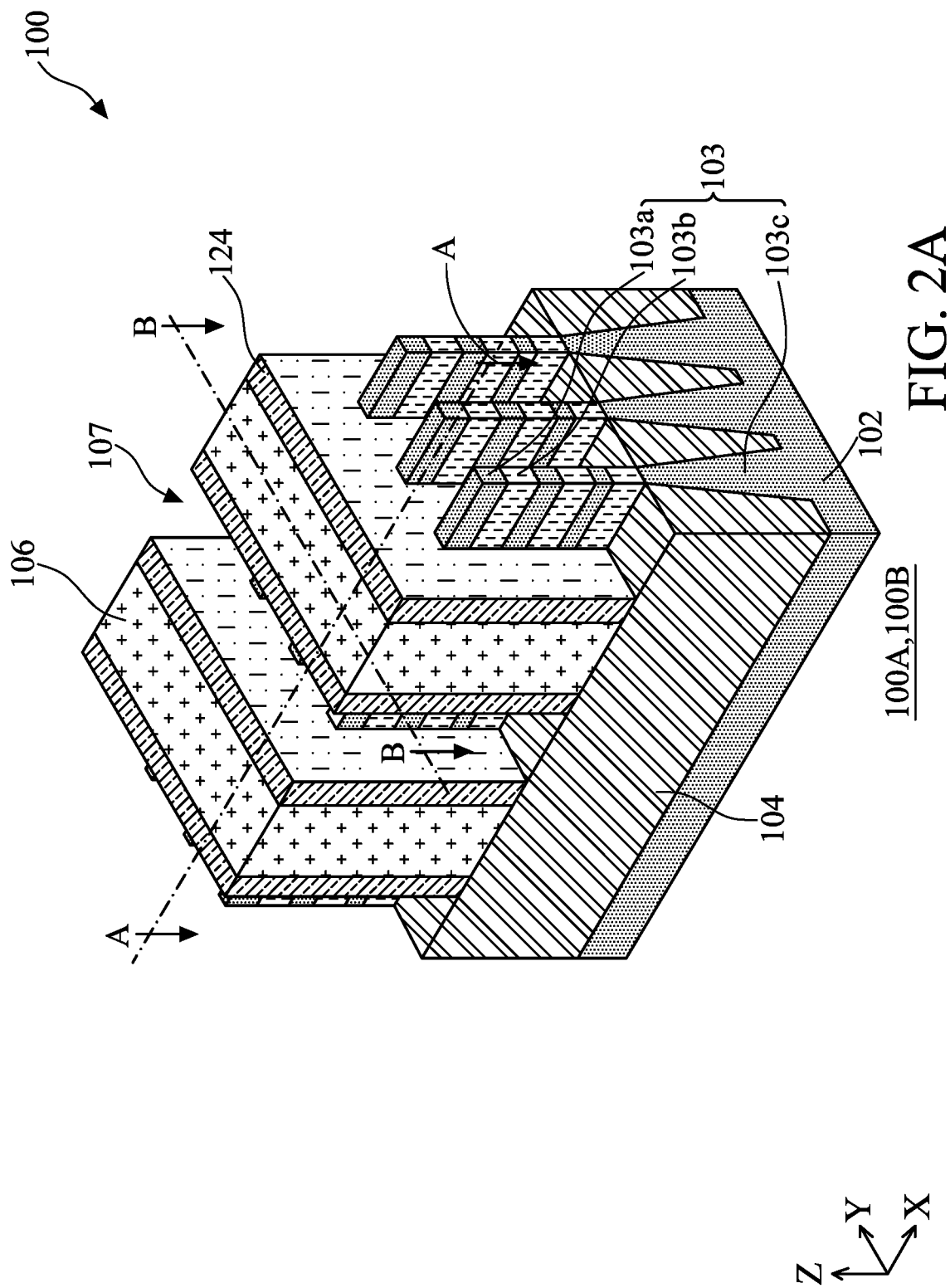
FIG. 2A is a diagrammatic perspective view of a multi-gate device, in portion, at a fabrication stage of the method in FIG. 1A and FIG. 1B, according to various aspects of the present disclosure.

FIG. 1A and FIG. 1B are a flow chart of a method 10 for fabricating a multi-gate device 100 according to various aspects of the present disclosure. In some embodiments, the multi-gate device 100 includes GAA transistors (or GAA devices) in a first area 100A of an IC and stacked FinFET transistors (or FinFET devices) in a second area 100B of the IC. For example, the first area 100A (such as a core area of the IC) includes transistors performing logic functions, transistors for memories (such as SRAM), and so on; and the second area 100B (such as an IO area of the IC) includes input/output transistors, electrostatic discharge (ESD) transistors, high voltage transistors, and so on. FIG. 2A is a diagrammatic perspective view of the multi-gate device 100, in portion, at a fabrication stage of the method 10, according to some aspects of the present disclosure. FIGS. 2B, 3, 4, 5, 6, 7, 8, 9, 10, 11, 12, 13, and 14 are diagrammatic cross-sectional views of the multi-gate device 100, in portion, along the "A-A" line in FIG. 2A, at various fabrication stages associated with the method 10, according to various aspects of the present disclosure. FIG. 15 is a diagrammatic cross-sectional view of the multi-gate device 100, in portion, along the "B-B" line in FIG. 2A, at a fabrication stage associated with the method 10, according to various aspects of the present disclosure. The method 10 includes operations 12 through 38. Additional processing is contemplated by the present disclosure. Additional operations can be provided before, during, and after the method 10, and some of the operations 12 through 38 can be moved, replaced, or eliminated for additional embodiments of the method 10.

The multi-gate device 100 may be included in a microprocessor, a memory, and/or other IC device. In some embodiments, the multi-gate device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), FinFET, nanosheet FETs, nanowire FETs, other types of multi-gate FETs, complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the multi-gate device 100 is included in memory devices, such as static random access memory (SRAM), non-volatile random access memory (NVRAM), flash memory, an electrically erasable programmable read only memory (EEPROM), an electrically programmable read-only memory (EPROM), other suitable memory type, or combinations thereof. FIGS. 2A-15 have been simplified for the sake of clarity to better understand the inventive concepts of the present disclosure. Additional features can be added in the multi-gate device 100, and some of the features described below can be replaced, modified, or eliminated in other embodiments of the multi-gate device 100. The fabrication of the device 100 is described below in conjunction with embodiments of the method 10.

Figure 2B:
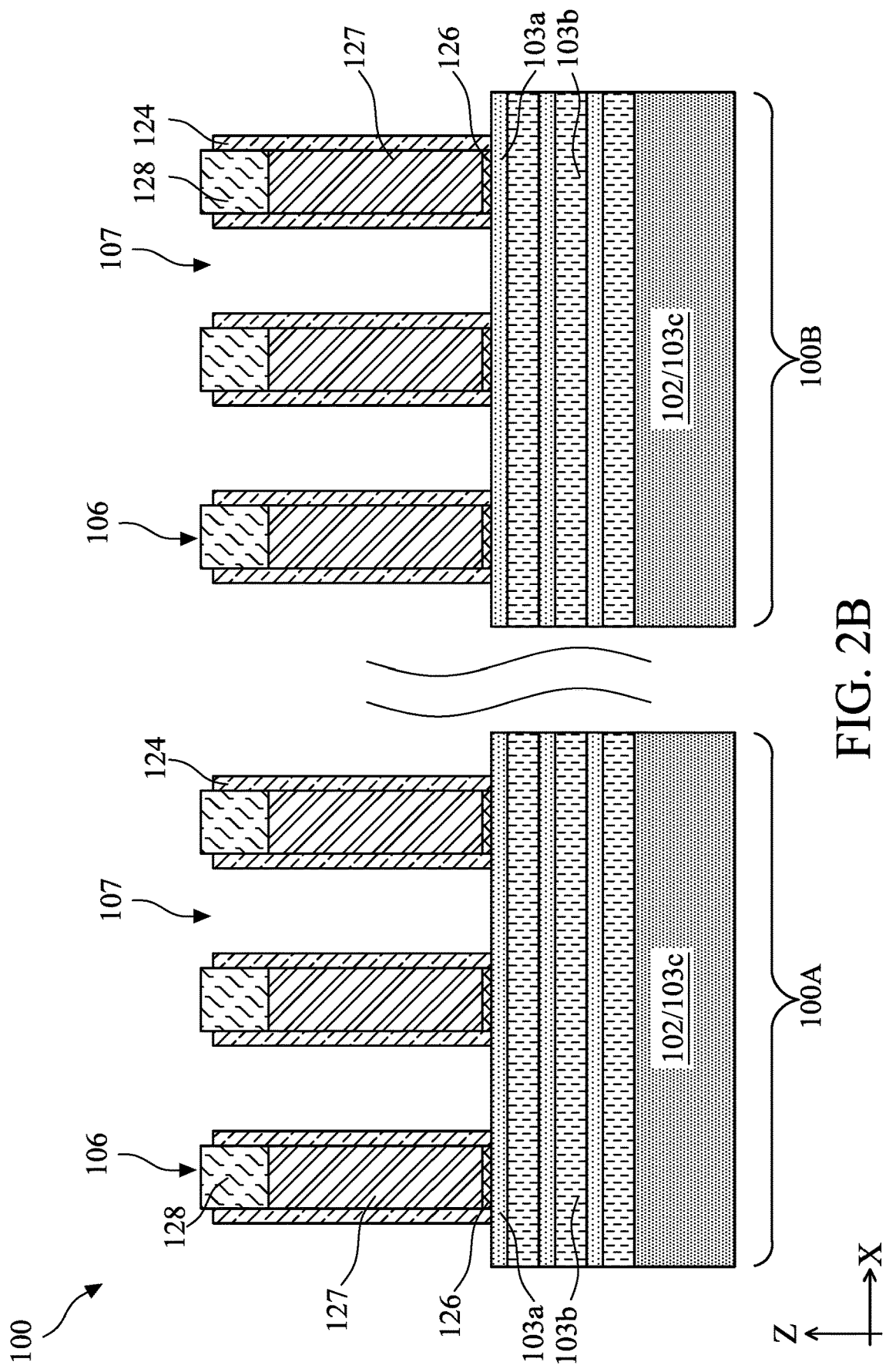
FIGS. 2B, 3, 4, 5, 6, 7, 8, 9, 10, 11, 12, 13, and 14 are diagrammatic cross-sectional views of a multi-gate device, in portion, along the "A-A" line in FIG. 2A, at various fabrication stages associated with the method in FIG. 1A and FIG. 1B, according to various aspects of the present disclosure.

At operation 12, the method 10 (FIG. 1A) provides an initial structure of the device 100. Turning to FIGS. 2A-2B, the device 100 includes a substrate 102. In both the first area 100A and the second area 100B, the device 100 includes fins 103 extending from the substrate 102, isolation structure 104 over the substrate 102 and isolating lower portions of the fins 103, sacrificial gate stacks 106 over the fins 103 and the isolation structure 104, and gate spacers 124 on sidewalls of the sacrificial gate stacks 106 and over top and sidewall surfaces of the fins 103. Each sacrificial gate stack 106 includes a sacrificial gate dielectric layer 126, a sacrificial gate electrode layer 127, and one or more hard mask layers 128. Each of the fins 103 includes a stack of semiconductor layers 103a and 103b over a base fin portion 103c. The stack of semiconductor layers 103a and 103b are above the isolation structure 104. The S/D regions of the fins 103 are exposed in trenches 107 between the sacrificial gate stacks 106. The fins 103 and the sacrificial gate stacks 106 in the first area 100A may have different dimensions than their counterparts in the second area 100B in some embodiments. For example, the width of the fins 103 along the "y" direction may be greater in the second area 100B than in the first area 100A in some embodiments. For example, the width of the sacrificial gate stacks 106 along the "x" direction may be greater in the second area 100B than in the first area 100A in some embodiments. For example, the pitch of the fins 103 and/or the pitch of the sacrificial gate stacks 106 may be greater in the second area 100B than in the first area 100A in some embodiments. The various components of the device 100 are further described below.

In the present embodiment, the substrate 102 includes silicon. For example, it is a silicon wafer. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions depending on design requirements of the device 100. For example, the substrate 102 may include p-type doped regions configured for n-type GAA transistors and n-type stacked FinFET transistors, and n-type doped regions configured for p-type GAA transistors and p-type stacked FinFET transistors. P-type doped regions are doped with p-type dopants, such as boron, indium, other p-type dopant, or combinations thereof. N-type doped regions are doped with n-type dopants, such as phosphorus, arsenic, other n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or other suitable doping process can be performed to form the various doped regions.

In the present embodiment, each of the fins 103 includes a base portion 103c and a stack of semiconductor layers 103a and semiconductor layers 103b arranged vertically (e.g., along the z-direction) in an interleaving or alternating configuration from the base portion 103c. In an embodiment, the base portion 103c includes a same semiconductor material as the substrate 102, and the semiconductor layers 103a and 103b are epitaxially grown from the base portion 103c in the depicted interleaving and alternating configuration, layer-by-layer, until a desired number of semiconductor layers is reached. In the depicted embodiment, each fin 103 includes three semiconductor layers 103a and three semiconductor layers 103b. However, the present disclosure contemplates embodiments where each fin 103 includes more or less semiconductor layers, for example, depending on a number of channels desired for the device 100. For example, each fin 103 may include two to ten semiconductor layers 103a and two to ten semiconductor layers 103b in some embodiments.

A composition of the semiconductor layers 103a is different than a composition of the semiconductor layers 103b to achieve etching selectivity and/or different oxidation rates during subsequent processing. For example, the semiconductor layers 103a and 103b may include different materials, different constituent atomic percentages, different constituent weight percentages, and/or other different characteristics to achieve desired etching selectivity during an etching process, such as an etching process implemented to form suspended channel layers in channel regions of the device 100. In the present embodiment, the semiconductor layers 103a include silicon and the semiconductor layers 103b include silicon germanium, which has a different etch selectivity than silicon. In some embodiments, the semiconductor layers 103a and 103b can include the same material but with different constituent atomic percentages to achieve the etching selectivity and/or different oxidation rates. For example, the semiconductor layers 103a and 103b can include silicon germanium, where the semiconductor layers 103a have a first silicon atomic percent and/or a first germanium atomic percent and the semiconductor layers 103b have a second, different silicon atomic percent and/or a second, different germanium atomic percent. The present disclosure contemplates that the semiconductor layers 103a and 103b include any combination of semiconductor materials that can provide desired etching selectivity, desired oxidation rate differences, and/or desired performance characteristics (e.g., materials that maximize current flow), including any of the semiconductor materials disclosed herein.

In some embodiments, thickness of each semiconductor layer 103a is about 1 nm to about 10 nm, thickness of each semiconductor layer 103b is about 1 nm to about 10 nm, and the two thicknesses can be the same or different. In an embodiment, the semiconductor layers 103a at the same stack level (for example, the $n^{th}$ semiconductor layer 103a from the surface of the base fin portion 103c) in the first area 100A and in the second area 100B are formed by the same process and have the same thickness and the same material, and the semiconductor layers 103b at the same stack level (for example, the $n^{th}$ semiconductor layer 103b from the surface of the base fin portion 103c) in the first area 100A and in the second area 100B are formed by the same process and have the same thickness and the same material.

The fins 103 may be patterned from a stack of semiconductor layers (103a and 103b) and the substrate 102 by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The isolation structure 104 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 104 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 104. Other types of isolation structure may also be suitable, such as field oxide and LOCal Oxidation of Silicon (LOCOS). The isolation structure 104 may include a multi-layer structure, for example, having one or more liner layers (e.g., silicon nitride) on surfaces of the substrate 102 and the fins 103 and a main isolating layer (e.g., silicon dioxide) over the one or more liner layers.

The sacrificial gate dielectric layer 126 may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 127 may include poly-crystalline silicon (poly-Si) or other material(s) and may be formed by suitable deposition processes such as low-pressure chemical vapor deposition (LPCVD) and plasma-enhanced CVD (PECVD). The hard mask layer(s) 128 may include silicon nitride, silicon oxide, and/or other suitable dielectric material and may be formed by CVD or other suitable methods. The various layers 126, 127, and 128 may be patterned by photolithography and etching processes. The gate spacers 124 may comprise a dielectric material, such as silicon oxide, silicon nitride, silicon oxynitride, silicon carbide, other dielectric material, or combinations thereof, and may comprise one or multiple layers of material. The gate spacers 124 may be formed by depositing a spacer material as a blanket over the isolation structure 104, the fins 103, and the sacrificial gate stacks 106. Then the spacer material is etched by an anisotropic etching process to expose the isolation structure 104, the hard mask layer 128, and a top surface of the fins 103. Portions of the spacer material on the sidewalls of the sacrificial gate stacks 106 become the gate spacers 124. Adjacent gate spacers 124 provide openings 107 that expose portions of the fins 103 in the S/D regions of the device 100.

Figure 3:
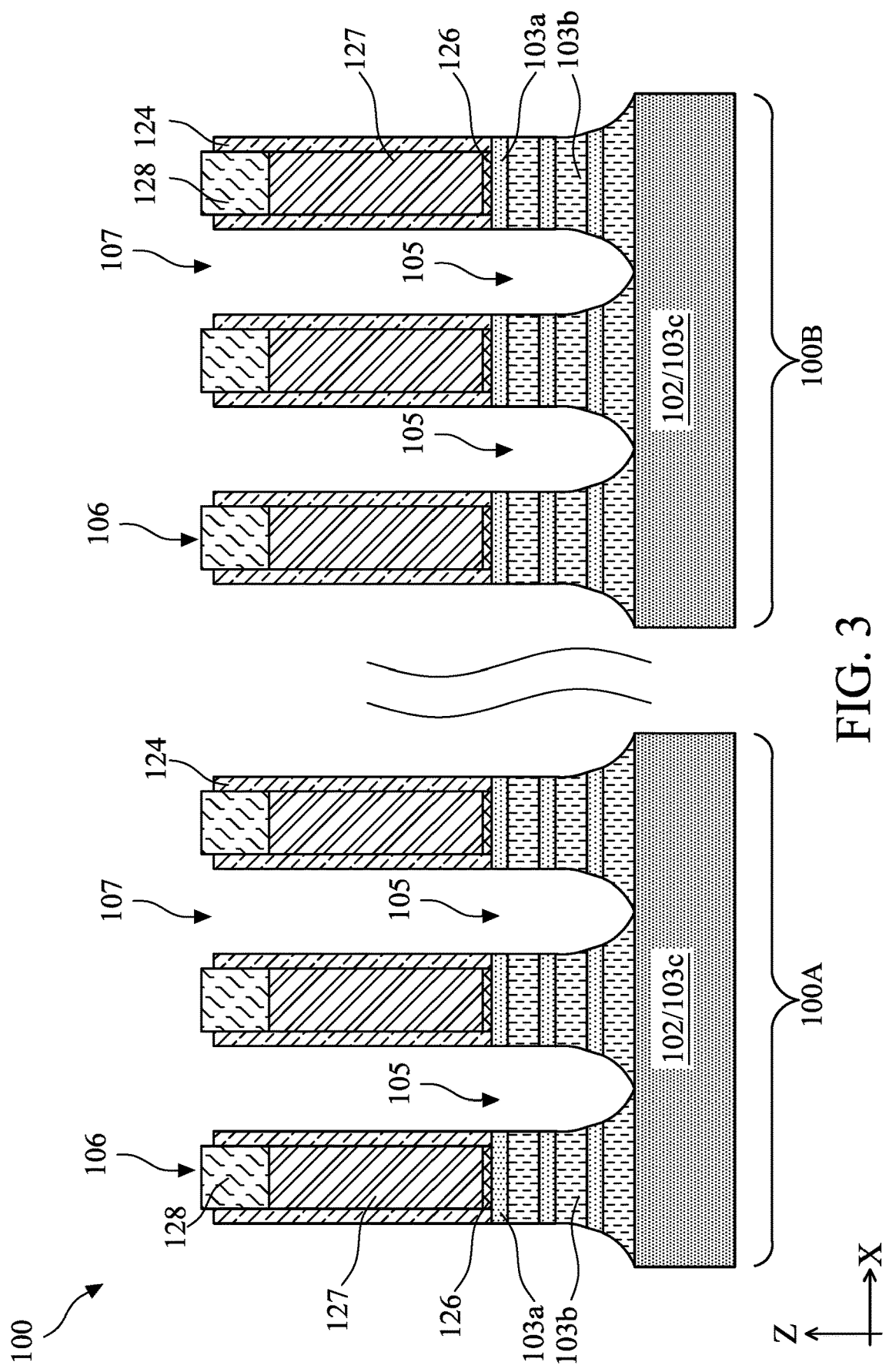

At operation 14, the method 10 (FIG. 1A) etches the fins 103 to form S/D trenches 105 in the first area 100A and in the second area 100B (FIG. 3). Operation 14 may include one or more photolithography process and etching processes. For example, the photolithography process may form a masking element covering areas of the device 100 that are not to be etched. The masking element provides openings through which the fins 103 are etched. For example, operation 14 may etch the S/D trenches 105 in the first area 100A and in the second area 100B separately by using a masking element. For another example, operation 14 may etch the S/D trenches 105 in PMOS regions and NMOS regions in the first area 100A separately, and etch the S/D trenches 105 in PMOS regions and NMOS regions in the second area 100B separately by using masking elements. In an embodiment, operation 14 etches the S/D trenches 105 in PMOS regions in the first area 100A and in the second area 100B at the same time while masking the NMOS regions in the first area 100A and in the second area 100B, and etches the S/D trenches 105 in NMOS regions in the first area 100A and in the second area 100B at the same time while masking the PMOS regions in the first area 100A and in the second area 100B. In an embodiment, operation 14 etches the S/D trenches 105 in PMOS and NMOS regions in the first area 100A and in the second area 100B at the same time while masking other area of the device 100. In an embodiment, the etching process may include dry etching, wet etching, reactive ion etching (RIE), and/or other suitable processes, as discussed earlier. Further, the etching process is tuned selective to the materials of the fins 103, and with no (or minimal) etching to the gate spacers 124, the hard mask layer 128, and the isolation structure 104. As a result of the etching process, various surfaces of the semiconductor layers 103a and 103b are exposed in each S/D trench 105. In some embodiments, the trenches 105 may extend into the base fin portions 103c.

Figure 4:
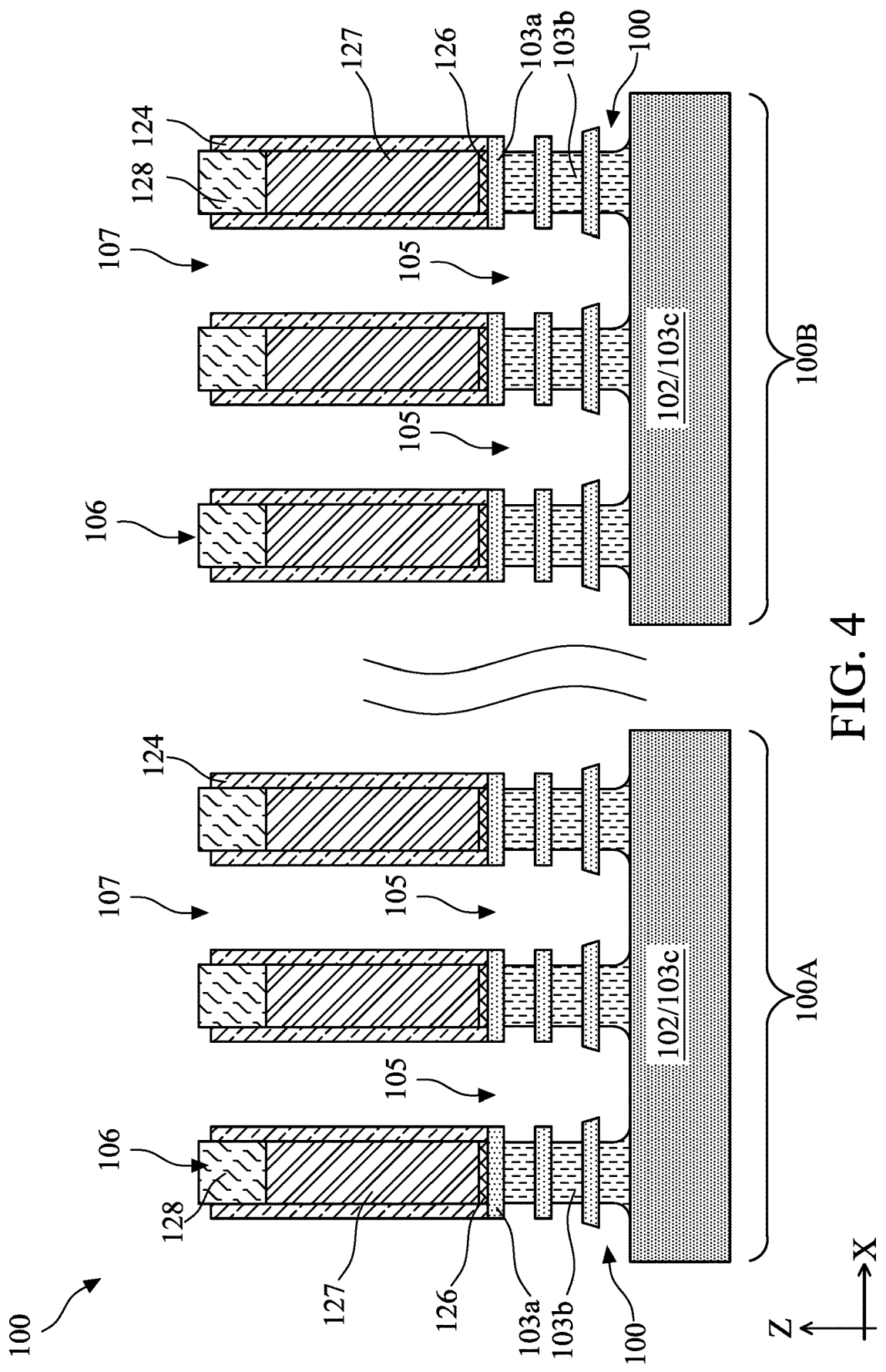

At operation 16, the method 10 (FIG. 1A) recesses the semiconductor layers 103b within the S/D trench 105 in both the first area 100A and the second area 100B, thereby creating gaps 110 between every two adjacent semiconductor layers 103a and between the bottommost semiconductor layer 103a and the base fin portion 103c, such as shown in FIG. 4. The gaps 110 may be etched to have a rectangular shape, a rounded shape, a trapezoidal shape, a funnel shape, or other shapes in various embodiments. In various embodiments, the operation 16 applies an etching process that is tuned selective to the material of the semiconductor layers 103b, and with no (or minimal) etching to the gate spacers 124, the hard mask layer 128, the isolation structure 104, and the semiconductor layers 103a. Various etching parameters can be tuned to achieve selective etching of the semiconductor layers 103b, such as etchant composition, etching temperature, etching solution concentration, etching time, etching pressure, source power, RF bias voltage, RF bias power, etchant flow rate, other suitable etching parameters, or combinations thereof. In an embodiment, the operation 16 applies an isotropic dry etching process (such as a surface gas/radical reaction process) to the semiconductor layers 103b with a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103b which includes silicon germanium. In some embodiments, a ratio of the fluorine-containing gas to an oxygen-containing gas (for example, $O_2$), an etching temperature, and/or an RF power may be tuned to selectively etch silicon germanium or silicon. In some embodiments, the operation 16 may further apply a cleaning process to the surfaces exposed in the S/D trench 105 after the etching process finishes. The cleaning process may include applying a diluted hydrofluoric acid (d-HF) to the various surfaces.

Figure 5:
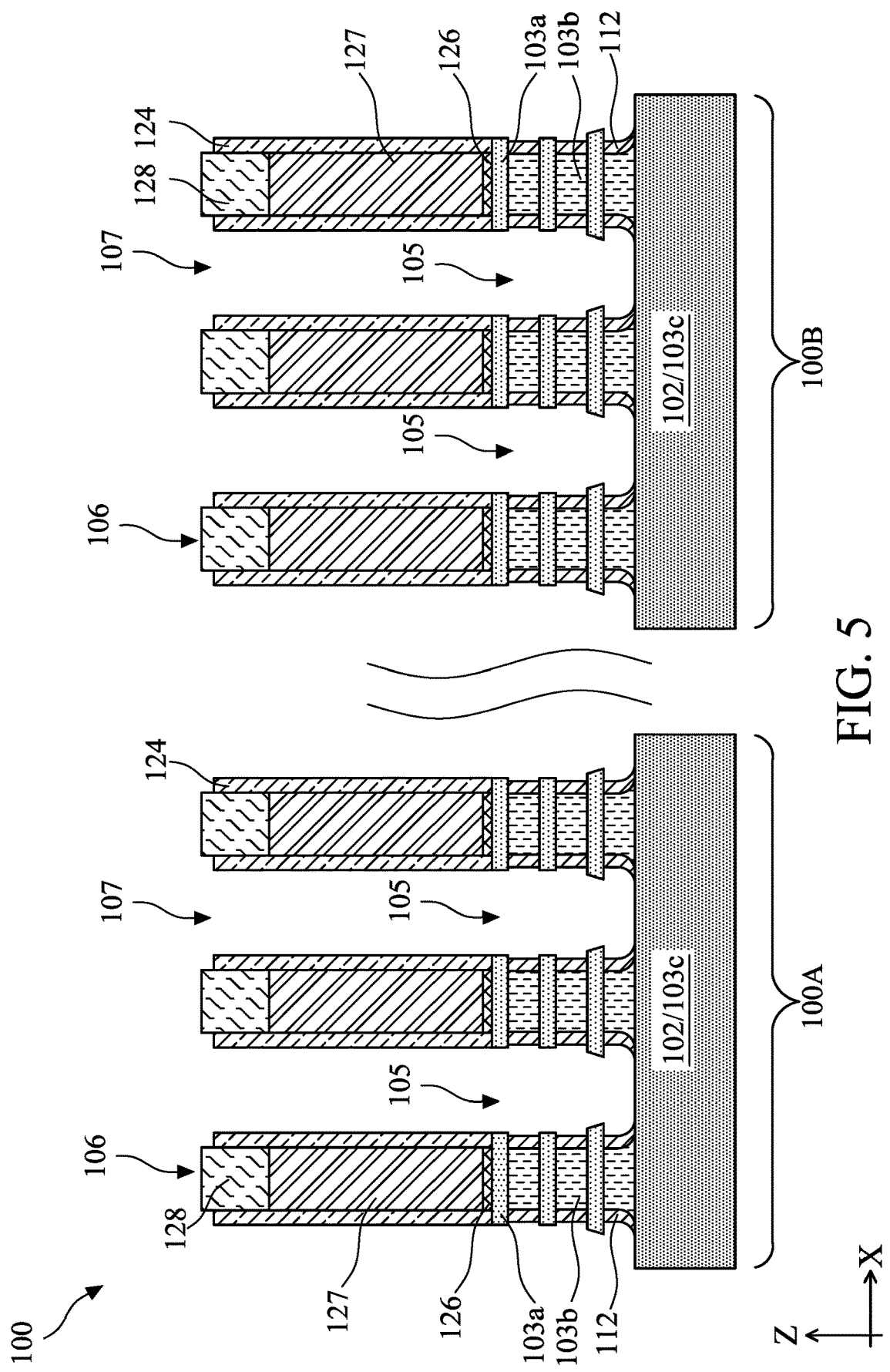

At operation 18, the method 10 (FIG. 1A) forms inner spacer features 112 in the gaps 110 in both the first area 100A and the second area 100B, such as shown in FIG. 5. This may involve multiple processes including deposition and etching. In an embodiment, the operation 18 first deposits a dielectric layer 112 along various surfaces of the device 100 that are exposed as a result of the operation 16 (such as the top surface of the sacrificial gate stacks 106, the sidewalls of the gate spacers 124, and the surfaces of the semiconductor layers 103a and 103b exposed in the S/D trenches 105), and then etches back the dielectric layer 112 to leave portions of the dielectric layer 112 in the gaps 110 as the inner spacer features 112. In various embodiments, the dielectric layer 112 may include a material that is different than materials in the semiconductor layers 103b and the gate spacers 124 to achieve desired etching selectivity during subsequent etching processes. In some embodiments, the dielectric layer 112 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric layer 112 includes a low-k dielectric material and/or air gap. Example low-k dielectric materials include fluoride-doped silica glass, carbon doped silicon oxide, Xerogel, Aerogel, amorphous fluorinated carbon, Parylene, Benzocyclobutene (BCB), polyimide, other low-k dielectric material, or combinations thereof. The dielectric layer 112 may be deposited using ALD, CVD, or other suitable methods. In various embodiments, the etch-back process may apply dry etching, wet etching, or reactive ion etching that is tuned selective to the material of the dielectric layer 112, and with minimal (to no) etching of the semiconductor layers 103a, the sacrificial gate stacks 106, and the gate spacers 124. For example, the etch-back process may apply an isotropic wet etching process.

Figure 6:
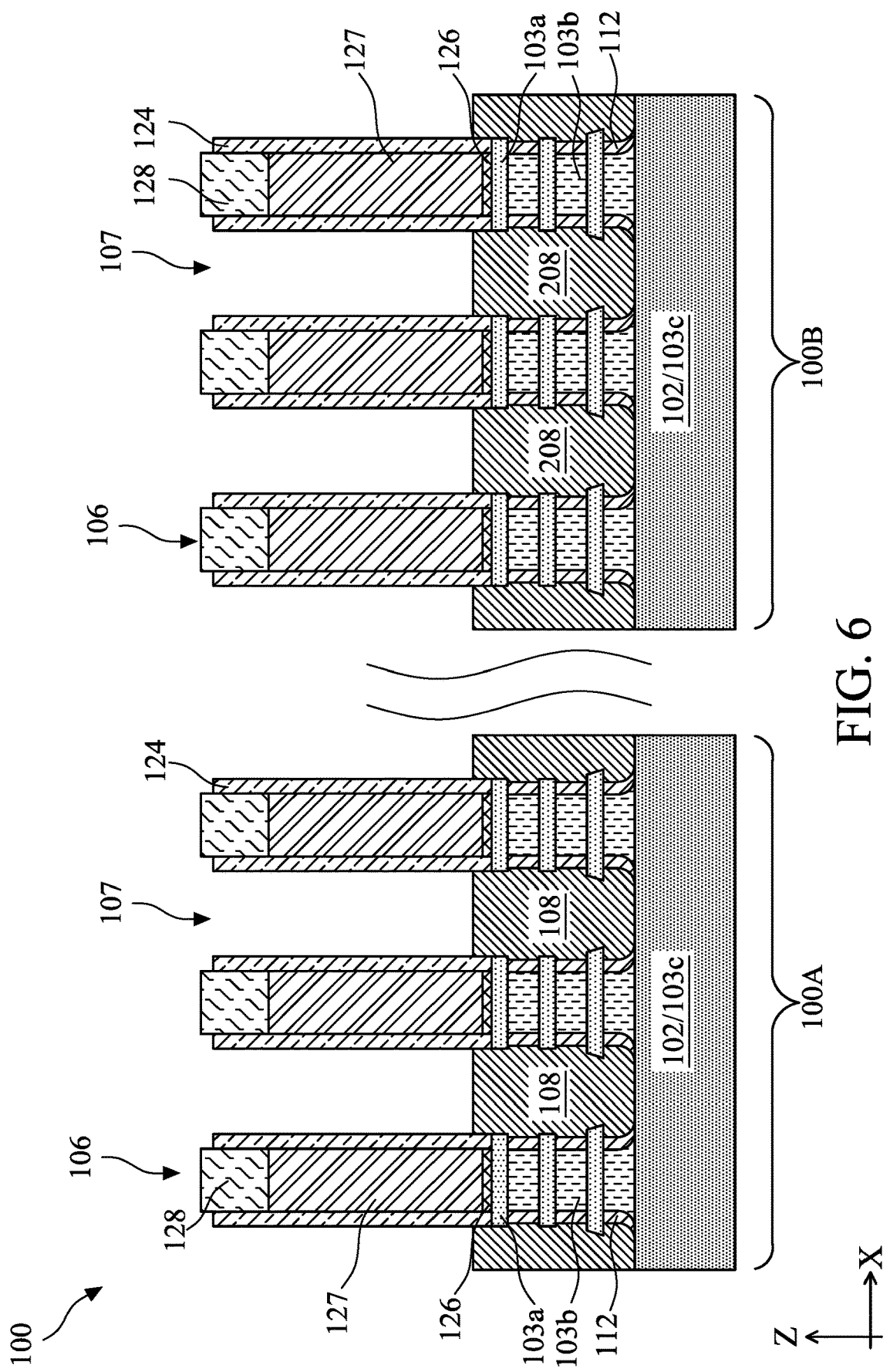

At operation 20, the method 10 (FIG. 1A) epitaxially grows source/drain (S/D) features 108 in the first area 100A and S/D features 208 in the second area 100B, as illustrated in FIG. 6. The S/D features 108 and 208 are grown from the surfaces of the semiconductor layers 103a and the base fin portion 103c (or the substrate 102 in some embodiments) that are exposed in the respective S/D trenches 105. The inner spacer features 112 separate the S/D features 108 and 208 from the semiconductor layers 103b. In an embodiment, the operation 20 may mask PMOS regions in the first area 100A and the second area 100B while epitaxially growing n-type S/D features 108 and 208 in NMOS regions in the first area 100A and the second area 100B, and mask NMOS regions in the first area 100A and the second area 100B while epitaxially growing p-type S/D features 108 and 208 in PMOS regions in the first area 100A and the second area 100B. In such embodiment, the operation 20 uses two masks, one for PMOS regions and another for NMOS regions. In another embodiment, the operation 20 uses four masks such that p-type S/D features 108 in the first area 100A, n-type S/D features 108 in the first area 100A, p-type S/D features 208 in the second area 100B, and n-type S/D features 208 in the second area 100B are separately grown. In such embodiments, the properties of the S/D features 108 and 208 can be individually tuned for core functions (such as logic, memory, etc.) and 10 functions (such as input/output, ESD, high voltage, etc.).

An epitaxy process can use chemical vapor deposition (CVD) techniques (for example, vapor phase epitaxy and/or Ultra-High Vacuum CVD), molecular beam epitaxy, other suitable epitaxial growth processes, or combinations thereof. The epitaxy process can use gaseous and/or liquid precursors, which interact with the composition of the semiconductor layers 103a, 103c, and 102. The method 10 may also dope the epitaxial source/drain features 108 and 208 with n-type dopants and/or p-type dopants. In some embodiments, for n-type transistors, the epitaxial source/drain features 108 and 208 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, the epitaxial source/drain features 108 and 208 include silicon germanium or germanium, and can be doped with boron, other p-type dopant, or combinations thereof (for example, forming Si:Ge:B epitaxial source/drain features). In some embodiments, the epitaxial source/drain features 108 and 208 may include multiple epitaxial semiconductor layers where the multiple epitaxial semiconductor layers have different levels of dopant density. Further, the doping can be in-situ (i.e., doped during deposition by adding impurities to a source material of the epitaxy process) or ex-situ (e.g., doped by an ion implantation process subsequent to a deposition process). In some embodiments, annealing processes (e.g., rapid thermal annealing (RTA) and/or laser annealing) are performed to activate dopants in the epitaxial source/drain features 108 and 208.

Figure 7:
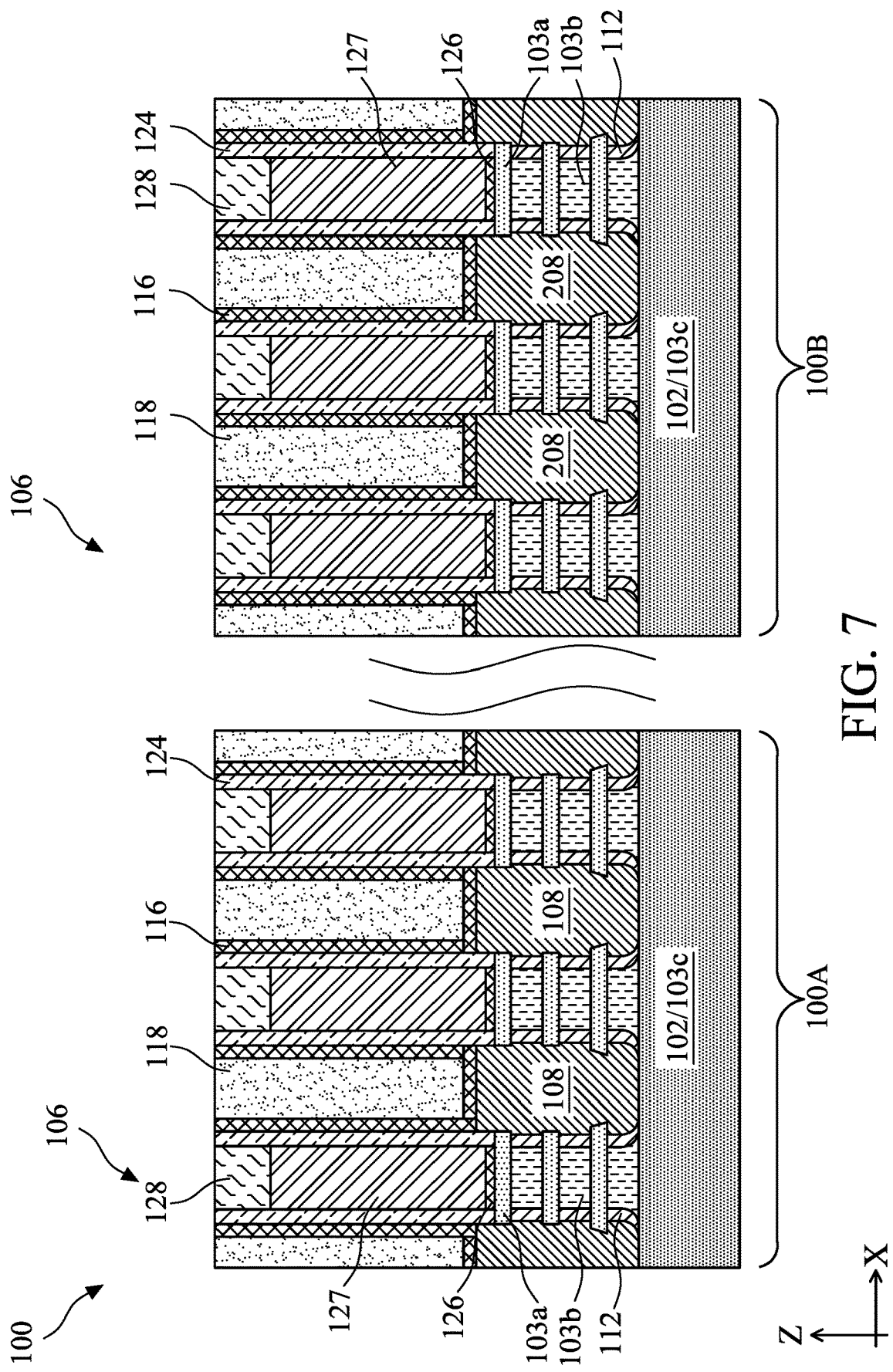
Figure 8:
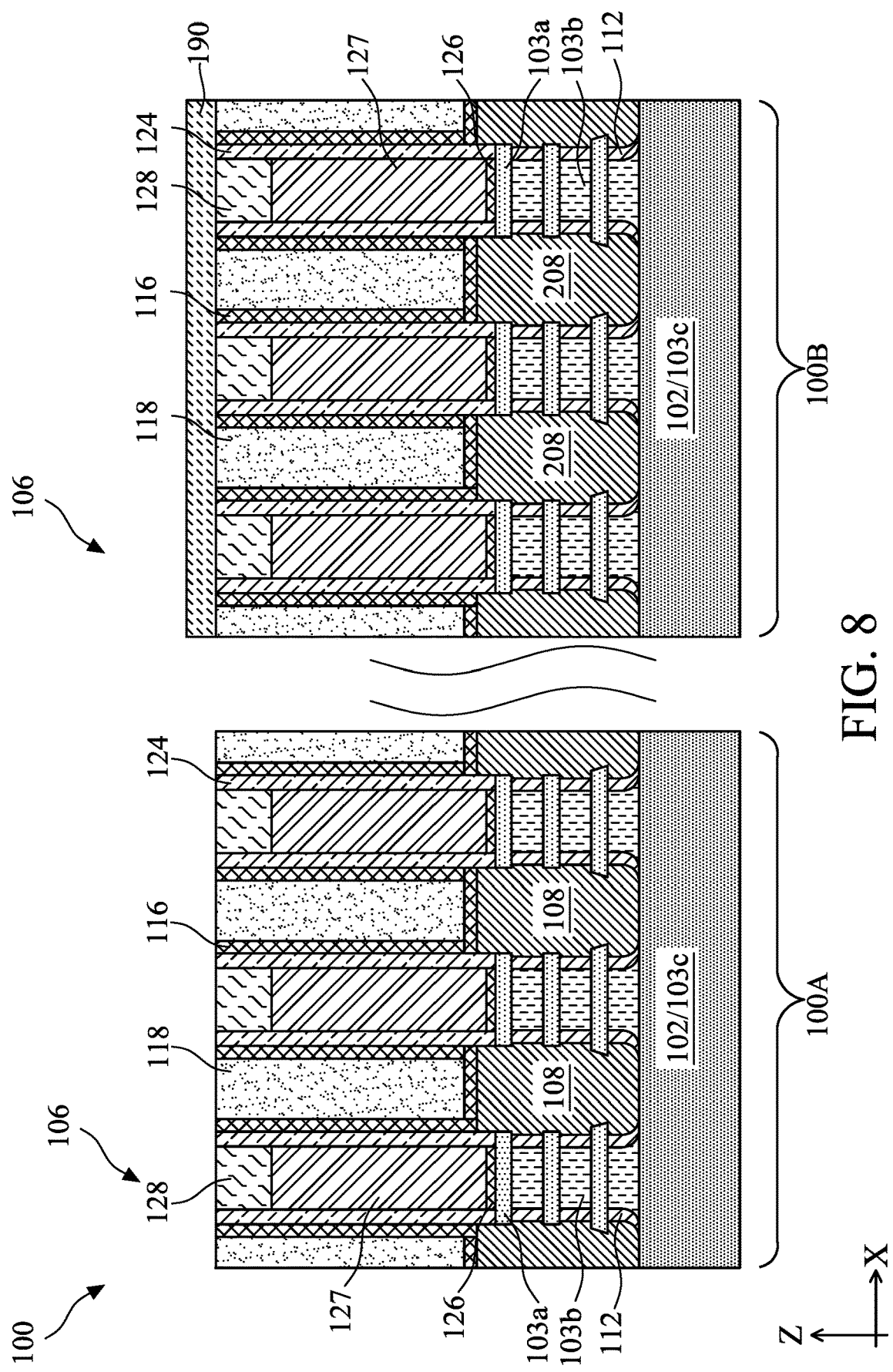

At operation 22, the method 10 (FIG. 1A) forms a contact etch stop layer (CESL) 116 and an inter-level dielectric (ILD) layer 118 over the device 100, such as shown in FIG. 7. At this fabrication stage, the S/D features 108 and 208 for both PMOS and NMOS regions in both the first area 100A and the second area 100B have been formed in the present embodiment. As illustrated in FIG. 7, the CESL 116 is formed over the S/D features 108 and 208, the sacrificial gate stacks 106, and the sidewalls of the gate spacers 124. The ILD layer 118 is deposited over the CESL 116. The CESL 116 may comprise silicon nitride, silicon oxynitride, silicon nitride with oxygen (O) or carbon (C) elements, and/or other materials; and may be formed by CVD, PVD, ALD, or other suitable methods. In an embodiment, the CESL 116 is deposited to a substantially uniform thickness along the various surfaces discussed above. The ILD layer 118 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 118 may be formed by PECVD (plasma enhanced CVD), FCVD (flowable CVD), or other suitable methods. The ILD layer 118 fills the various trenches between the sacrificial gate stacks 106 and between the respective S/D features 108 and 208. In an embodiment, the operation 22 may perform a CMP process to the device 100 to expose a top surface of the sacrificial gate stacks 106 after the ILD layer 118 is deposited.

At operation 24, the method 10 (FIG. 1B) forms an etch mask 190 that covers the second area 100B and exposes the first area 100A. The mask 190 includes a material that is different than a material of the sacrificial gate stacks 106 to achieve etching selectivity during the removal of the sacrificial gate stacks 106. For example, the mask 190 may include a resist material (and thus may be referred to as a patterned resist layer and/or a patterned photoresist layer). In some embodiments, the mask 190 has a multi-layer structure, such as a resist layer disposed over an anti-reflective coating (ARC) layer and/or a hard mask layer. The present disclosure contemplates other materials for the mask 190, so long as etching selectivity is achieved during the removal of the sacrificial gate stacks 106. In some embodiments, the operation 24 includes a lithography process that includes forming a resist layer over the device 100 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 190) includes a resist pattern that corresponds with the photomask, where the patterned resist layer covers the second area 100B and exposes the first area 100A. Alternatively, the exposure process can be implemented or replaced by other methods, such as maskless lithography, e-beam writing, ion-beam writing, or combinations thereof.

Figure 9:
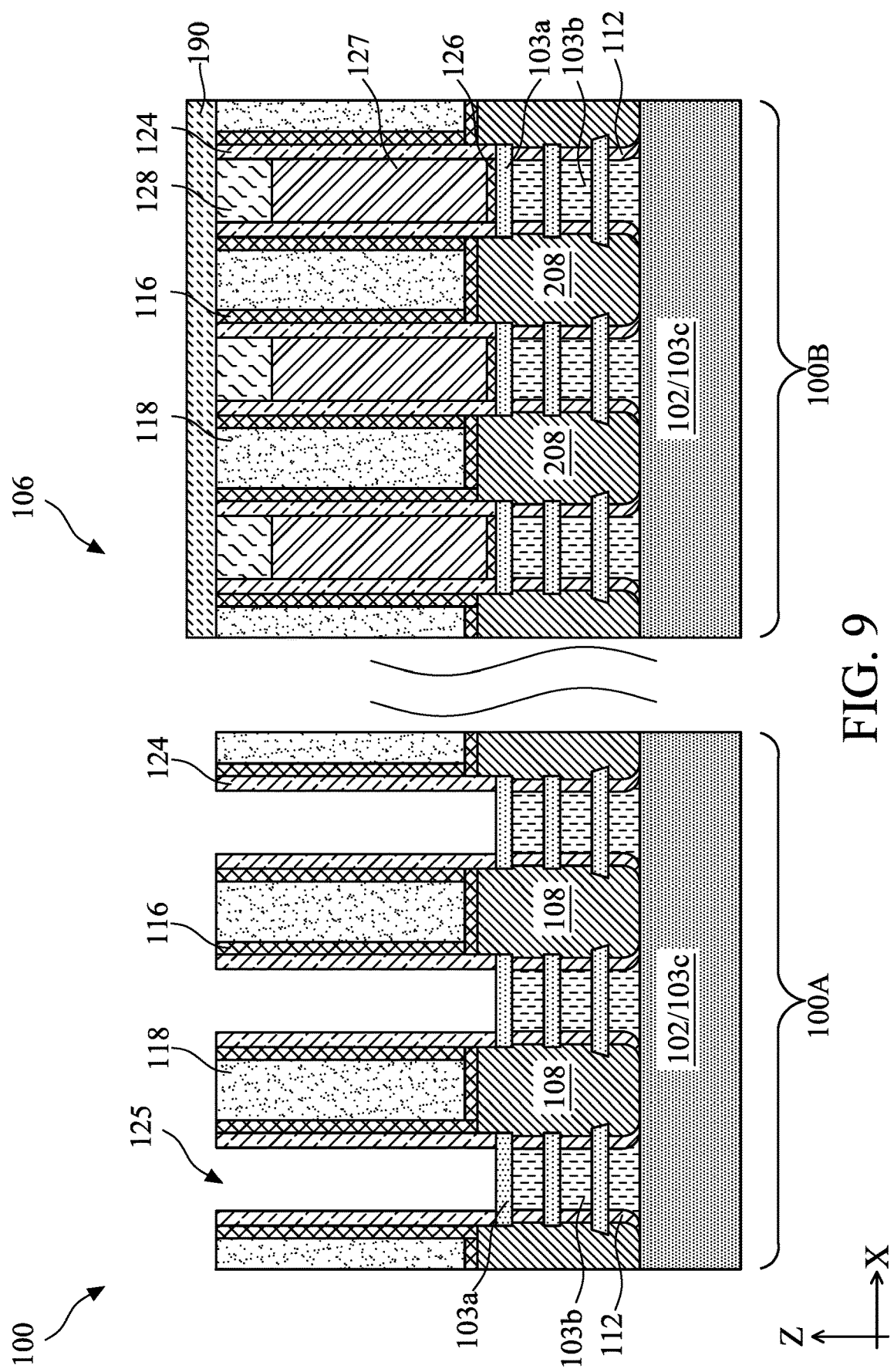

At operation 26, the method 10 (FIG. 1B) removes the sacrificial gate stacks 106 from the first area 100A, thereby forming gate trenches 125 in the first area 100A, such as shown in FIG. 9. In an embodiment, the operation 26 performs one or more etching process to remove the sacrificial gate stacks 106, including the hard mask layer(s) 128, the sacrificial gate electrode layer 127, and the sacrificial gate dielectric layer 126. The etching process may include dry etching, wet etching, reactive ion etching, combinations thereof, or other suitable etching processes. The etching process is tuned selective to the materials of the sacrificial gate stacks 106, with no (or minimal) etching to the ILD layer 118, the CESL 116, the gate spacers 124, and the fins 103 (including the semiconductor layers 103a and 103b). As depicted in FIG. 9, the etching process results in gate trenches 125 between two opposing gate spacers 124. The gate trenches 125 expose channel regions of the fins 103.

Figure 10:
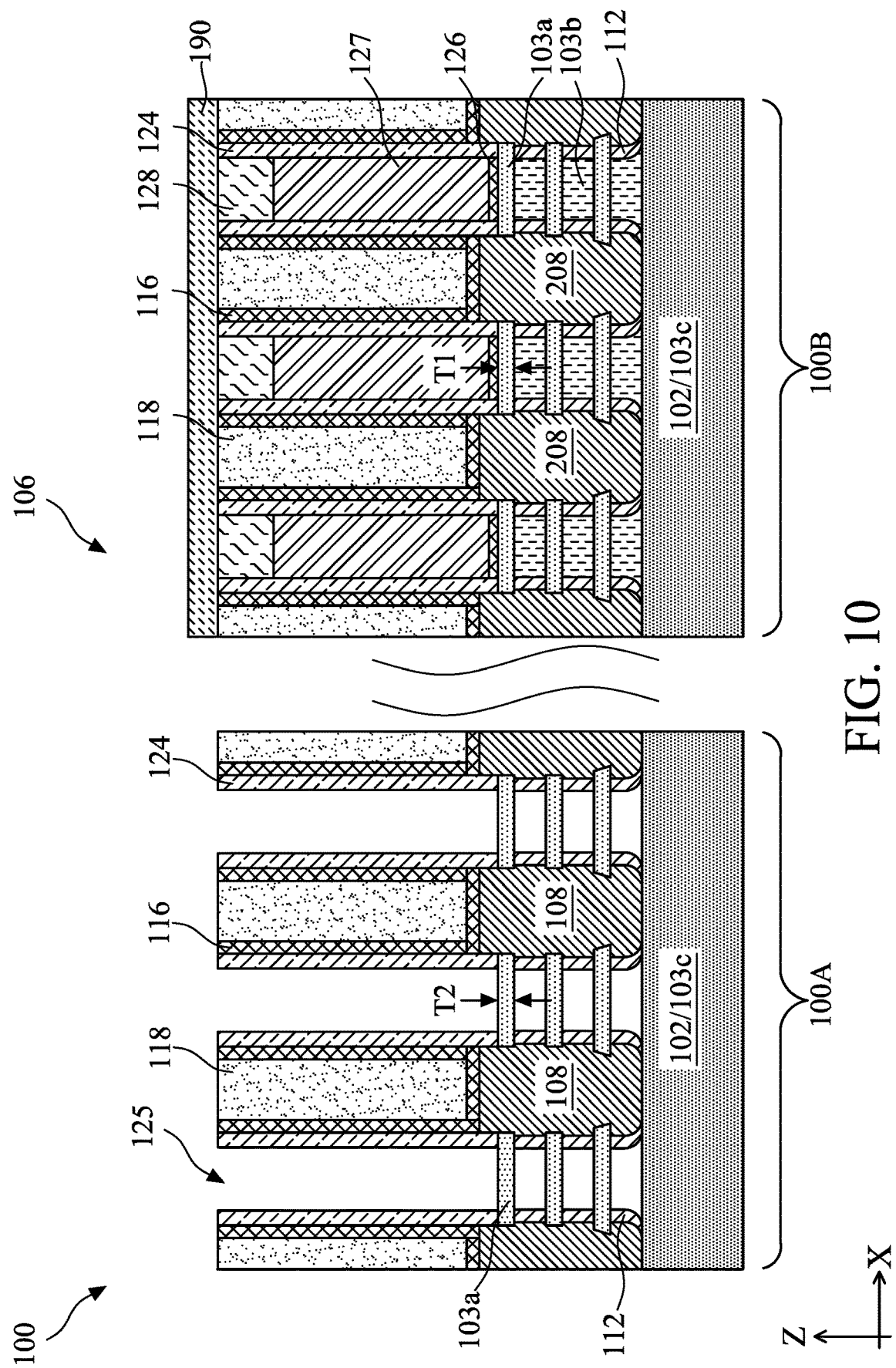

At operation 28, the method 10 (FIG. 1B) selectively removes the semiconductor layers 103b from the gate trenches 125 in the first area 100A, such as shown in FIG. 10. This process is also referred to as a channel release process in some embodiments. In the embodiment depicted in FIG. 10, an etching process selectively etches the semiconductor layers 103b with minimal (to no) etching of the semiconductor layers 103a and, in some embodiments, minimal (to no) etching of the gate spacers 124 and/or the inner spacer features 112. Various etching parameters can be tuned to achieve selective etching of the semiconductor layers 103b, such as etchant composition, etching temperature, etching solution concentration, etching time, etching pressure, source power, RF bias voltage, RF bias power, etchant flow rate, other suitable etching parameters, or combinations thereof. The etching process can be a dry etching process, a wet etching process, other suitable etching process, or combinations thereof. In some embodiments, a dry etching process (such as a surface gas/radical reaction process) utilizes a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103b which include silicon germanium. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide (NH$_4$OH) and water (H$_2$O) to selectively etch the semiconductor layers 103b. In some embodiments, a chemical vapor phase etching process using hydrochloric acid (HCl) selectively etches the semiconductor layers 103b. Because of the etch selectivity, the inner spacer features 112 protects the S/D features 108 from the etching process.

As a result of the operation 28, the semiconductor layers 103a are suspended over the base fin portion 103c and the substrate 102 and connecting the S/D features 108 on opposing sides of each gate trench 125. In some embodiments, after removing the semiconductor layers 103b, an etching process may be optionally performed to modify a profile of the semiconductor layers 103a to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the semiconductor layers 103a have sub-nanometer dimensions depending on design requirements of the device 100. In an embodiment, as a result of the channel release process (and the optional further etching process), the thickness T2 of the semiconductor layers 103a in the first area 100A becomes smaller than the thickness T1 of the semiconductor layers 103a in the second area 100B for the semiconductor layers 103a at the same stack level.

Figure 11:
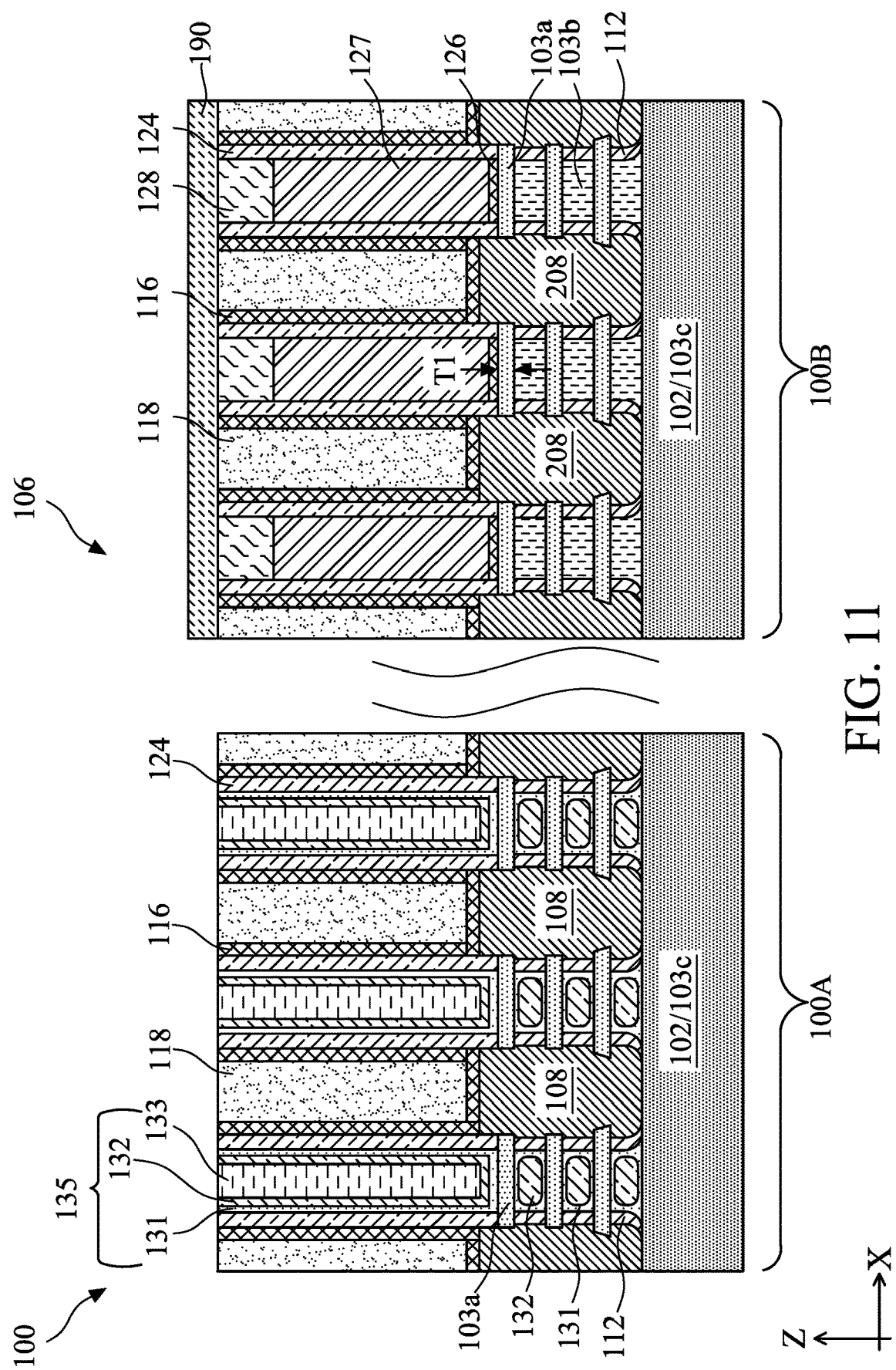

At operation 30, the method 10 (FIG. 1B) forms high-k metal gate stacks (HKMG) 135 in the gate trenches 125, surrounding each of the semiconductor layers 103a, such as shown in FIG. 11. FIG. 15, on the left, further illustrates that the HKMG 135 surrounds each of the semiconductor layers 103a. In an embodiment, the HKMG 135 includes a gate dielectric layer 131, a work function metal layer 132 over the gate dielectric layer 131, and a metal fill layer 133 over the work function metal layer 132. The gate dielectric layer 131 may include a high-k dielectric material such as hafnium oxide, zirconium oxide, lanthanum oxide, titanium oxide, yttrium oxide, and strontium titanate. The gate dielectric layer 131 may be formed by chemical oxidation, thermal oxidation, atomic layer deposition (ALD), chemical vapor deposition (CVD), and/or other suitable methods. In some embodiments, the HKMG 135 further includes an interfacial layer between the gate dielectric layer 131 and the semiconductor layers 103a. The interfacial layer may include silicon oxide, silicon oxynitride, or other suitable materials. In some embodiments, the work function metal layer 132 includes an n-type or a p-type work function layer depending on the type of the GAA transistor. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The work function metal layer 132 may be formed by CVD, PVD, ALD, and/or other suitable processes. In embodiments, the metal fill layer 133 may include aluminum, tungsten, cobalt, copper, and/or other suitable materials, and may be formed by CVD, PVD, plating, and/or other suitable processes. The HKMG 135 is separated from the S/D features 108 by the gate spacers 124 and the inner spacer features 112. In some embodiments, there may be additional layer(s) between the gate dielectric layer 131 and the work function metal layer 132, and/or additional layer(s) surrounded by the work function metal layer 132. In embodiments where the HKMG 135 includes an interfacial layer as discussed earlier, the interfacial layer is disposed between the gate dielectric layer 131 and the inner spacer feature 112 (i.e., the interfacial layer is disposed in direct contact with the inner spacer feature 112 and the two adjacent layers of the semiconductor layers 103a). In an embodiment where the HKMG 135 does not include an interfacial layer, the gate dielectric layer 131 is disposed in direct contact with the inner spacer feature 112.

Figure 12:
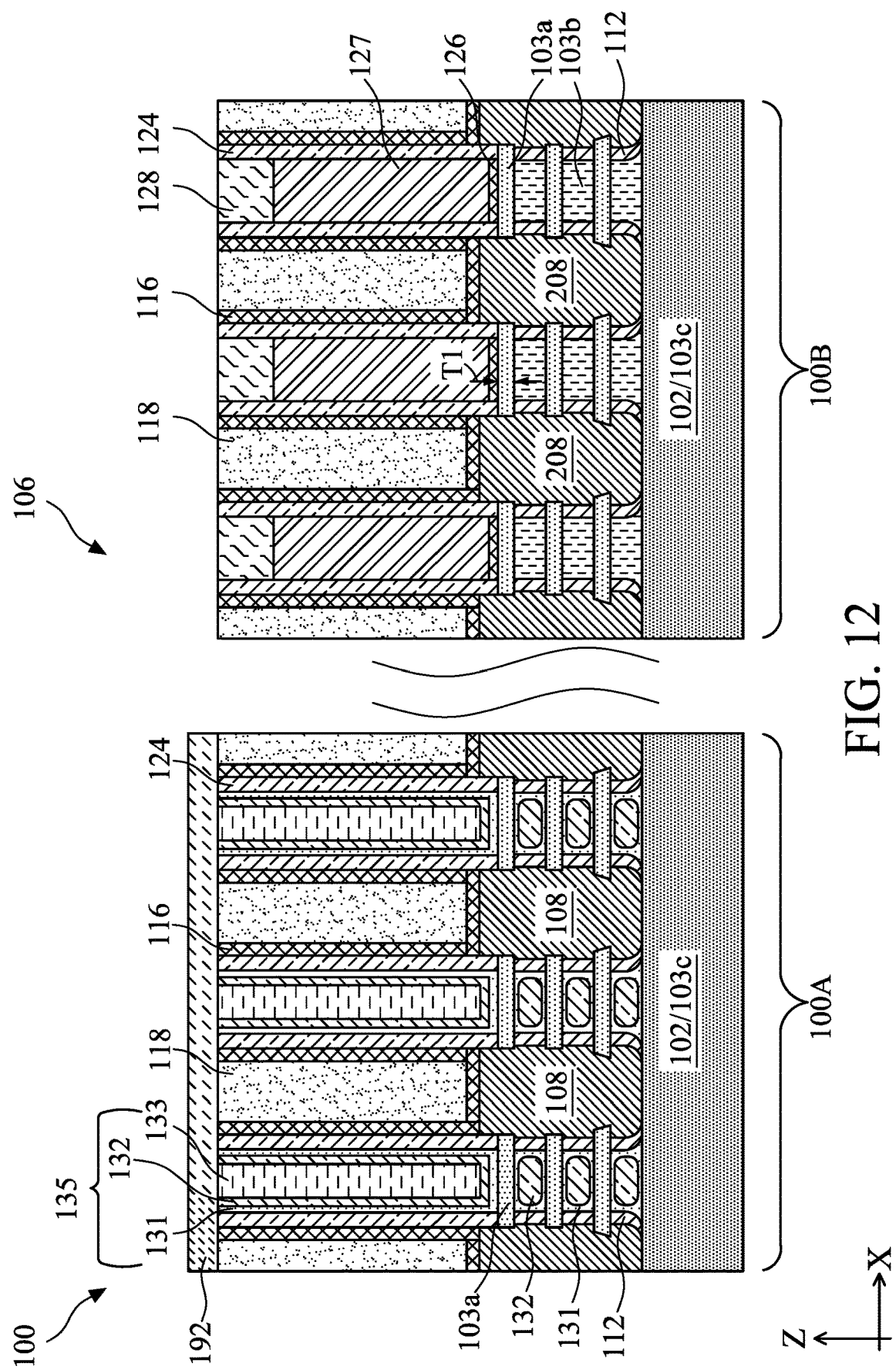

At operation 32, the method 10 (FIG. 1B) removes the mask 190 from the second area 100B and forms a mask 192 that covers the first area 100A and exposes the second area 100B, such as shown in FIG. 12. The mask 192 may include material(s) that are the same as or similar to those for the mask 190, and may be formed with method(s) that are the same as or similar to those for forming the mask 190.

Figure 13:
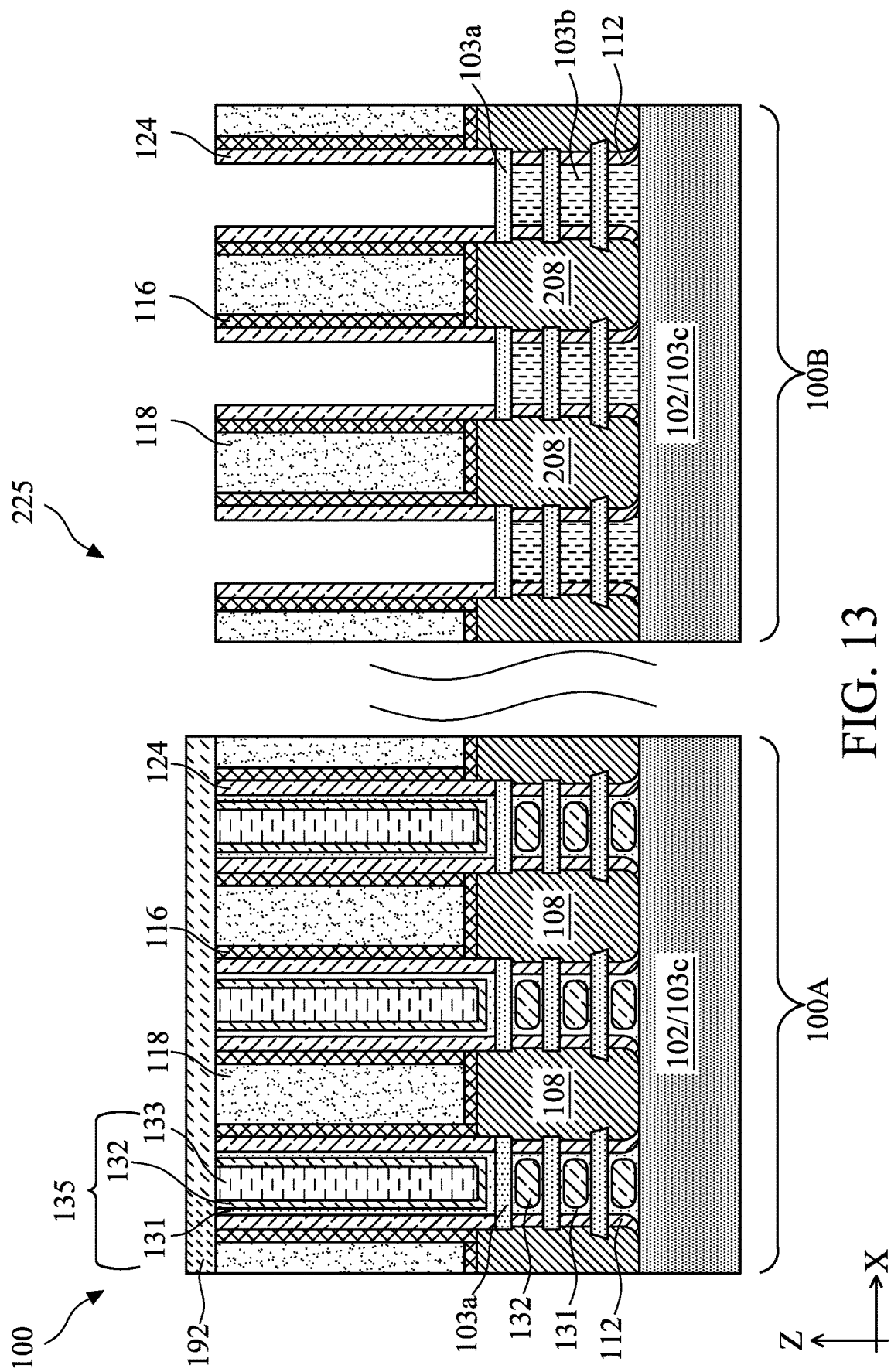

At operation 34, the method 10 (FIG. 1B) removes the sacrificial gate stacks 106 from the second area 100B, thereby forming gate trenches 225 in the second area 100B, such as shown in FIG. 13. Aspects of the operation 34 are the same as or substantially similar to those of the operation 26, and are omitted herein for simplicity.

Figure 14:
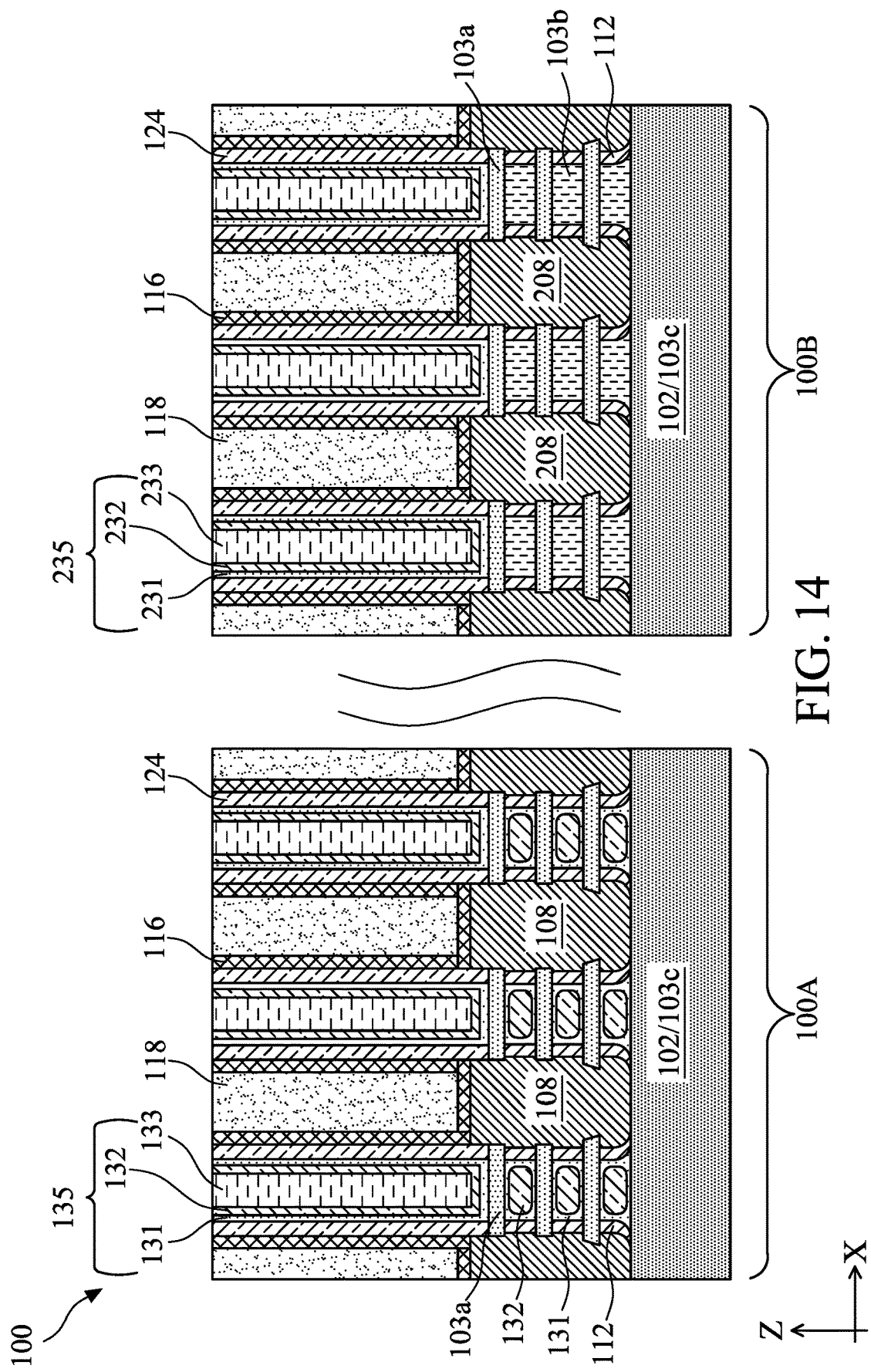
Figure 15:
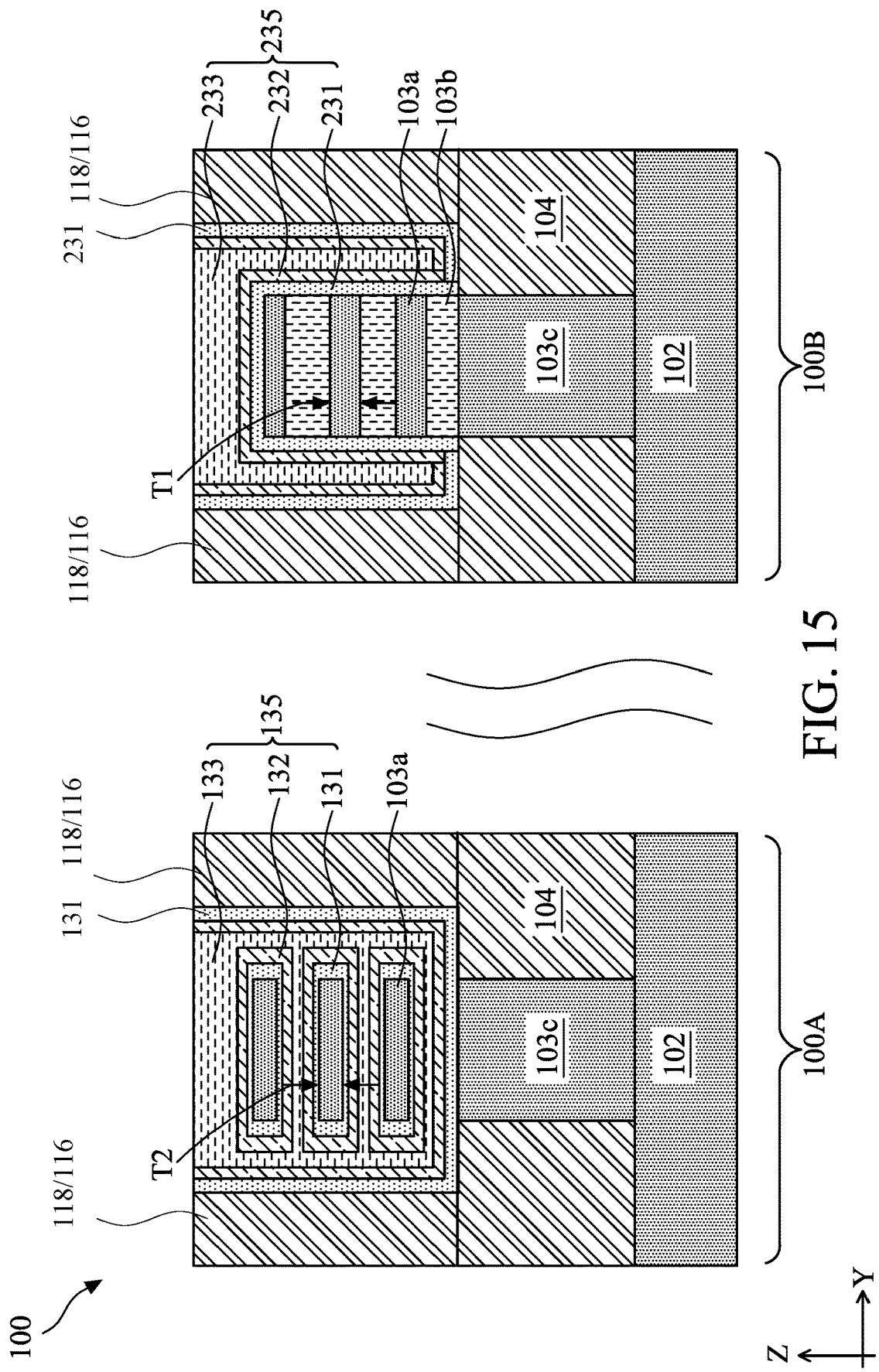
FIG. 15 is a diagrammatic cross-sectional view of a multi-gate device, in portion, along the "B-B" line in FIG. 2A, at a fabrication stage associated with the method in FIG. 1A and FIG. 1B, according to various aspects of the present disclosure.

At operation 36, the method 10 (FIG. 1B) forms high-k metal gate stacks (HKMG) 235 in the gate trenches 225, such as shown in FIG. 14. FIG. 15, on the right, further illustrates that the HKMG 235 are disposed on top and sidewall surfaces of the fins 103, each of which includes the semiconductor layers 103a and 103b. Since the semiconductor layers 103b are separated from the S/D features 208 by the inner spacer features 112, the main conducting channels in the device in the second area 100B are the semiconductor layers 103a. In some embodiments, such configuration provides a more uniform device performance (such as threshold voltage, saturation current, and so on) than a configuration where the inner spacer features 112 are not included in the second area 100B. In some embodiments, the device in the second area 100B may be considered as multiple FinFET stacked one over another and controlled by the same HKMG 235. Since the devices in the second area 100B do not go through the channel release process like the devices in the first area 100A do, the thickness T1 of the semiconductor layers 103a is (or remains) greater than the thickness T2 of the semiconductor layers 103a in the first area 100A when measured at about the center of the respective semiconductor layers at the same stack level.

In an embodiment, the HKMG 235 includes a gate dielectric layer 231, a work function metal layer 232 over the gate dielectric layer 231, and a metal fill layer 233 over the work function metal layer 232. The gate dielectric layer 231 may include a high-k dielectric material such as hafnium oxide, zirconium oxide, lanthanum oxide, titanium oxide, yttrium oxide, and strontium titanate. The gate dielectric layer 231 may be formed by chemical oxidation, thermal oxidation, atomic layer deposition (ALD), chemical vapor deposition (CVD), and/or other suitable methods. In an embodiment, the gate dielectric layer 231 is formed to be thicker than the gate dielectric layer 131. For example, a thicker gate dielectric layer 231 allows the transistors in the second area 100B to operate at a higher voltage than the transistors in the first area 100A. In some embodiments, the HKMG 235 includes an interfacial layer between the gate dielectric layer 231 and the semiconductor layers 103a. The interfacial layer may include silicon oxide, silicon oxynitride, or other suitable materials. In some embodiments, the work function metal layer 232 includes an n-type or a p-type work function layer depending on the type of the stacked FinFET transistor. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The work function metal layer 232 may be formed by CVD, PVD, ALD, and/or other suitable processes. In embodiments, the metal fill layer 233 may include aluminum, tungsten, cobalt, copper, and/or other suitable materials, and may be formed by CVD, PVD, plating, and/or other suitable processes. The HKMG 235 is separated from the S/D features 208 by the gate spacers 124. In some embodiments, there may be additional layer(s) between the gate dielectric layer 231 and the work function metal layer 232, and/or additional layer(s) surrounded by the work function metal layer 232. In embodiments where the HKMG 235 includes an interfacial layer as discussed earlier, the interfacial layer is disposed between the gate dielectric layer 231 and the surfaces of the fins 103. In an embodiment where the HKMG 235 does not include an interfacial layer, the gate dielectric layer 231 is disposed in direct contact with the surfaces of the fins 103.

In some embodiments, the method 10 may perform the operations 24 through 36 in a different order than the one illustrated in FIGS. 8 through 14. For example, the method 10 may perform the operations 32, 34, and 36 to form the HKMG 235, and then perform the operations 24, 26, 28, and 30 to form the HKMG 135.

At operation 38, the method 10 (FIG. 1B) performs further fabrication steps to the device 100. For example, the method 10 may etch the ILD layer 118 and the CESL 116 in the S/D regions of the device 100 to form contact holes exposing the S/D features 108 and 208, form silicide features on the S/D features 108 and 208, form S/D contacts over the silicide features, form gate contacts connecting to the HKMG 135 and HKMG 235, and form interconnect layers.

Although not intended to be limiting, embodiments of the present disclosure provide one or more of the following advantages. First, embodiments of the present disclosure provide inner spacer features in different areas (such as a core area and an IO area) of an IC. This improves the transistors' uniformity and simplifies the manufacturing processes over approaches where the inner spacer features are provided in one area but not in the other area. Second, embodiments of the present disclosure provide GAA transistors in core areas of an IC and stacked FinFET transistors in IO areas of the IC to meet different performance targets of the transistors in the two areas. For example, the GAA transistors may provide high operation speed and/or low power consumption, while the stacked FinFET transistors provide high operation voltage and high drive capability. Third, embodiments of the present disclosure can be readily integrated with existing semiconductor manufacturing processes.

In one example aspect, the present disclosure is directed to an integrated circuit (IC). The IC includes a substrate, a stacked FinFET transistor on the substrate in a second area of the IC, and a gate-all-around (GAA) transistor on the substrate in a first area of the IC. The stacked FinFET transistor includes two first source/drain features, a stack of first semiconductor layers and second semiconductor layers alternately stacked one over another and disposed between the two first source/drain features, a first gate dielectric layer disposed over top and sidewalls of the stack of the first and the second semiconductor layers, a first gate electrode layer disposed over the first gate dielectric layer, and first spacer features disposed laterally between each of the second semiconductor layers and each of the two first source/drain features. The first and the second semiconductor layers include different materials, and the first semiconductor layers electrically connect the two first source/drain features. The GAA transistor includes two second source/drain features, a stack of third semiconductor layers that electrically connect the two second source/drain features, a second gate dielectric layer wrapping around each of the third semiconductor layers, a second gate electrode over the second gate dielectric layer, and second spacer features disposed laterally between the second gate dielectric layer and each of the two second source/drain features.

In some embodiment of the IC, the first semiconductor layers and the third semiconductor layers include a same semiconductor material. In some further embodiment, one of the first semiconductor layers is at a same stack level as one of the third semiconductor layers, and a middle portion of the one of the first semiconductor layers is thicker than a middle portion of the one of the third semiconductor layers.

In some embodiment of the IC, the first and the third semiconductor layers include silicon and the second semiconductor layers include silicon germanium. In some embodiment, the first spacer features and the second spacer features include a same dielectric material. In a further embodiment, the first and the second spacer features include a low-k dielectric material, silicon oxide, silicon nitride, silicon oxynitride, silicon carbide, or silicon oxycarbide, or silicon oxycarbonitride.

In an embodiment, the IC further includes a first gate spacer disposed over sidewalls of the first gate electrode layer and over top and sidewall surfaces of the stack of the first semiconductor layers and the second semiconductor layers, and a second gate spacer disposed over sidewalls of the second gate electrode layer and over a topmost layer of the stack of the third semiconductor layers. In some embodiment of the IC, the first gate dielectric layer is thicker than the second gate dielectric layer.

In another example aspect, the present disclosure is directed to a method of manufacturing an integrated circuit (IC). The method includes providing a structure having a substrate, a first fin over the substrate in a second area of the IC, a second fin over the substrate in a first area of the IC, first and second sacrificial gate stacks engaging channel regions of the first and the second fins respectively, first and second gate spacers on sidewalls of the first and the second sacrificial gate stacks respectively. Each of the first and the second fins includes first layers of a first semiconductor material and second layers of a second semiconductor material different from the first semiconductor material. The first layers and the second layers are alternately stacked over the substrate. The method further includes etching the first fin adjacent the first gate spacers, resulting in first source/drain trenches; etching the second fin adjacent the second gate spacers, resulting in second source/drain trenches; partially recessing the second layers exposed in the first and the second source/drain trenches, resulting in gaps between adjacent layers of the first layers in the first and the second fins; and forming inner spacer features in the gaps in the first and the second fins.

In an embodiment of the method, the etching of the first fin and the etching of the second fin are performed by a same process. In an embodiment, the method further includes epitaxially growing first source/drain features in the first source/drain trenches and epitaxially growing second source/drain features in the second source/drain trenches. In a further embodiment, the method includes forming an interlevel dielectric layer over the first and the second source/drain features and over the first and the second sacrificial gate stacks. In a further embodiment, the method includes forming a first etch mask covering the first area and exposing the second area; removing the first sacrificial gate stack through the first etch mask to form a first gate trench; and forming a first gate dielectric layer in the first gate trench and over the top and sidewalls of the first fin having both the first and the second layers. In a further embodiment, the method includes forming a second etch mask covering the second area and exposing the first area; removing the second sacrificial gate stack through the second etch mask to form a second gate trench; removing the second layers of the second fin from the second gate trench, leaving the first layers of the second fin suspended over the substrate; and forming a second gate dielectric layer wrapping around each of the first layers of the second fin. In a further embodiment, the method includes forming a first gate electrode layer over the first gate dielectric layer and forming a second gate electrode layer over the second gate dielectric layer.

In yet another example aspect, the present disclosure is directed to a method of manufacturing an integrated circuit (IC). The method includes providing a structure having a substrate, a first fin over the substrate in a second area of the IC, a second fin over the substrate in a first area of the IC, first and second sacrificial gate stacks over the first and the second fins respectively, and first and second gate spacers on sidewalls of the first and the second sacrificial gate stacks respectively. Each of the first and the second fins includes first layers of a first semiconductor material and second layers of a second semiconductor material different from the first semiconductor material. The first layers and the second layers are alternately stacked over the substrate. The method further includes etching the first and the second fins, resulting in first source/drain trenches adjacent the first gate spacers and second source/drain trenches adjacent the second gate spacers; partially recessing the second layers exposed in the first and the second source/drain trenches, resulting in gaps between adjacent layers of the first layers in the first and the second fins; forming inner spacer features in the gaps in the first and the second fins; and after the forming of the inner spacer features, epitaxially growing first and second source/drain features in the first and the second source/drain trenches respectively.

In an embodiment, the method further includes forming a first etch mask covering the first area and exposing the second area; removing the first sacrificial gate stack through the first etch mask to form a first gate trench that exposes top and sidewalls of the first fin having both the first and the second layers; forming a first gate dielectric layer over the top and sidewalls of the first fin having both the first and the second layers; and forming a first gate electrode layer over the first gate dielectric layer.

In another embodiment, the method further includes forming a second etch mask covering the second area and exposing the first area; removing the second sacrificial gate stack through the second etch mask to form a second gate trench; removing the second layers of the second fin from the second gate trench, leaving the first layers of the second fin suspended over the substrate; forming a second gate dielectric layer wrapping around each of the first layers of the second fin; and forming a second gate electrode layer over the second gate dielectric layer.

In an embodiment of the method, the inner spacer features include a low-k dielectric material, silicon oxide, silicon nitride, silicon oxynitride, silicon carbide, or silicon oxycarbide, or silicon oxycarbonitride. In a further embodiment, the first semiconductor material includes epitaxially grown silicon and the second semiconductor material includes epitaxially grown silicon germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a substrate; and
   a first transistor on the substrate, wherein the first transistor includes two first source/drain features, a stack of first semiconductor layers and second semiconductor layers alternately stacked one over another and disposed between the two first source/drain features, a first gate dielectric layer disposed over and in direct contact with top and sidewalls of the stack of the first and the second semiconductor layers, a first gate electrode layer disposed over the first gate dielectric layer, and first spacer features disposed laterally between each of the second semiconductor layers and each of the two first source/drain features and electrically isolating each of the second semiconductor layers from each of the two first source/drain features, wherein the first semiconductor layers electrically connect the two first source/drain features.

2. The IC of claim 1, wherein the first semiconductor layers and the second semiconductor layers include different materials.

3. The IC of claim 1, wherein the first semiconductor layers include silicon and the second semiconductor layers include silicon germanium.

4. The IC of claim 1, wherein the first gate dielectric layer includes a high-k dielectric material.

5. The IC of claim 1, further comprising:
   a first fin base portion disposed vertically between the substrate and the stack of the first and the second semiconductor layers.

6. The IC of claim 1, wherein the first transistor is in a first area of the IC, further comprising:
   a second transistor on the substrate in a second area of the IC, wherein the first area is different from the second area, wherein the second transistor includes two second source/drain features, a stack of third semiconductor layers that electrically connect the two second source/drain features, a second gate dielectric layer wrapping around each of the third semiconductor layers, a second gate electrode over the second gate dielectric layer, and second spacer features disposed laterally between the second gate dielectric layer and each of the two second source/drain features.

7. The IC of claim 6, further comprising:
a second fin base portion disposed vertically between the substrate and the stack of the third semiconductor layers.

8. The IC of claim 7, further comprising:
a first fin base portion disposed vertically between the substrate and the stack of the first and the second semiconductor layers; and
an isolation structure laterally separating the first fin base portion from the second fin base portion.

9. The IC of claim 6, wherein the first semiconductor layers and the third semiconductor layers include a same semiconductor material.

10. The IC of claim 6, wherein the first gate dielectric layer is thicker than the second gate dielectric layer.

11. An integrated circuit (IC), comprising:
a substrate; and
a first transistor on the substrate, wherein the first transistor includes:
two first source/drain features,
a first fin base portion on the substrate,
a stack of first semiconductor layers and second semiconductor layers alternately stacked one over another, wherein the stack of the first and the second semiconductor layers are disposed vertically above the first fin base portion and laterally between the two first source/drain features, wherein the first and the second semiconductor layers include different materials,
a dielectric interfacial layer in direct contact with top and sidewalls of the stack of the first and the second semiconductor layers,
a first gate dielectric layer disposed over the dielectric interfacial layer,
a first gate electrode layer disposed over the first gate dielectric layer, and
first dielectric spacers disposed laterally between each of the second semiconductor layers and each of the two first source/drain features,
wherein the first semiconductor layers electrically connect the two first source/drain features.

12. The IC of claim 11, wherein the first transistor is in a first area of the IC, further comprising:
a second transistor on the substrate in a second area of the IC, wherein the first area is different from the second area,
wherein the second transistor includes:
two second source/drain features,
a second fin base portion on the substrate,
a stack of third semiconductor layers above the second fin base portion and electrically connecting the two second source/drain features,
a second gate dielectric layer wrapping around each of the third semiconductor layers,
a second gate electrode over the second gate dielectric layer, and
second dielectric spacers disposed laterally between the second gate dielectric layer and each of the two second source/drain features.

13. The IC of claim 12, further comprising:
an isolation structure over the substrate and adjacent to the first and the second fin base portions, wherein the stack of the first and the second semiconductor layers and the stack of the third semiconductor layers are above the isolation structure.

14. The IC of claim 12, wherein one of the first semiconductor layers is at a same vertical level as one of the third semiconductor layers from a top surface of the substrate, a middle portion of the one of the first semiconductor layers is thicker than a middle portion of the one of the third semiconductor layers.

15. The IC of claim 12, wherein the first gate dielectric layer is thicker than the second gate dielectric layer.

16. The IC of claim 12, wherein the first semiconductor layers, the third semiconductor layers, and the substrate include a same material.

17. The IC of claim 12, wherein the first area is an IO area of the IC, and the second area is a core area of the IC.

18. An integrated circuit (IC), comprising:
a substrate;
a first transistor on the substrate and in an IO area of the IC; and
a second transistor on the substrate and in a core area of the IC,
wherein the first transistor includes:
two first source/drain features,
a first fin base portion on the substrate,
a stack of first semiconductor layers and second semiconductor layers alternately stacked one over another, wherein the stack of the first and the second semiconductor layers are disposed vertically above the first fin base portion and laterally between the two first source/drain features, wherein the first and the second semiconductor layers include different materials,
a first gate dielectric layer disposed in direct contact with top and sidewalls of the stack of the first and the second semiconductor layers,
a first gate electrode layer disposed over the first gate dielectric layer, and
first dielectric spacers disposed laterally between each of the second semiconductor layers and each of the two first source/drain features,
wherein the first semiconductor layers directly interface with the two first source/drain features,
wherein the second transistor includes:
two second source/drain features,
a second fin base portion on the substrate,
a stack of third semiconductor layers above the second fin base portion and directly interfacing with the two second source/drain features,
a second gate dielectric layer wrapping around each of the third semiconductor layers,
a second gate electrode over the second gate dielectric layer, and
second dielectric spacers disposed laterally between the second gate dielectric layer and each of the two second source/drain features.

19. The IC of claim 18, wherein one of the first semiconductor layers is at a same vertical level as one of the third semiconductor layers from a top surface of the substrate, a middle portion of the one of the first semiconductor layers is thicker than a middle portion of the one of the third semiconductor layers.

20. The IC of claim 18, wherein the first gate dielectric layer comprises:
a dielectric interfacial layer; and
a high-k dielectric layer disposed over the dielectric interfacial layer.

* * * * *